US012721150B2

(12) United States Patent
Huang

(10) Patent No.: US 12,721,150 B2
(45) Date of Patent: Aug. 25, 2026

(54) SEMICONDUCTOR DEVICE WITH ASSISTING LAYER AND METHOD FOR FABRICATING THE SAME

(71) Applicant: NANYA TECHNOLOGY CORPORATION, New Taipei City (TW)

(72) Inventor: Chin-Ling Huang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 498 days.

(21) Appl. No.: 18/237,018

(22) Filed: Aug. 23, 2023

(65) Prior Publication Data

US 2024/0347453 A1 Oct. 17, 2024

Related U.S. Application Data

(62) Division of application No. 18/133,062, filed on Apr. 11, 2023.

(51) Int. Cl.
*H10W 20/41* (2026.01)
*H10W 20/00* (2026.01)

(52) U.S. Cl.
CPC ....... *H10W 20/435* (2026.01); *H10W 20/056* (2026.01); *H10W 20/075* (2026.01); *H10W 20/425* (2026.01)

(58) Field of Classification Search
CPC ............. H10W 20/425; H10W 20/435; H10W 20/056; H10W 20/076; H10W 20/075;
(Continued)

(56) References Cited

U.S. PATENT DOCUMENTS 12,501,686 B2 * 12/2025 Huang .................... H10D 64/66
2016/0293552 A1 * 10/2016 Yim .................... H10W 20/425
(Continued)

FOREIGN PATENT DOCUMENTS

TW 573344 B 1/2004
TW 200427064 A 12/2004
(Continued)

OTHER PUBLICATIONS

Office Action and Search Report mailed on Aug. 30, 2024 related to Taiwanese Application No. 113107764.

*Primary Examiner* — John M Parker
(74) *Attorney, Agent, or Firm* — Xuan Zhang

(57) ABSTRACT

A semiconductor device includes a first insulating layer inwardly positioned in a substrate and including a U-shaped cross-sectional profile; a first assisting layer conformally positioned on the first insulating layer and the substrate; a first filler layer positioned on the first assisting layer; and a capping dielectric layer positioned on the substrate and covering the first assisting layer and the first filler layer. A top surface of the first insulating layer is at a vertical level lower than a top surface of the substrate. The first assisting layer includes a first step portion and a second step portion, the first step portion of the first assisting layer is adjacent to the top surface of the first insulating layer, and the second step portion of the first assisting layer is adjacent to the top surface of the substrate.

18 Claims, 29 Drawing Sheets

(58) Field of Classification Search
CPC ............... H10W 20/42; H10W 20/033; H10W 20/0552
See application file for complete search history.

(56) References Cited

U.S. PATENT DOCUMENTS

| | | | | |
|---|---|---|---|---|
| 2018/0130707 | A1* | 5/2018 | Clendenning | H10W 20/057 |
| 2018/0212055 | A1 | 7/2018 | Chen et al. | |
| 2019/0198389 | A1* | 6/2019 | Ren | H10W 20/037 |
| 2022/0344340 | A1* | 10/2022 | Lin | H10B 12/033 |
| 2023/0260834 | A1* | 8/2023 | Brogan | C23C 16/45553 118/715 |
| 2024/0071821 | A1* | 2/2024 | Lee | H10W 20/033 |

FOREIGN PATENT DOCUMENTS

| | | | |
|---|---|---|---|
| TW | I691060 | B | 4/2020 |
| TW | 202023029 | A | 6/2020 |

* cited by examiner

SEMICONDUCTOR DEVICE WITH ASSISTING LAYER AND METHOD FOR FABRICATING THE SAME

CROSS-REFERENCE TO RELATED APPLICATION

This application is a divisional application of U.S. Non-Provisional application Ser. No. 18/133,062 filed Apr. 11, 2023, which is incorporated herein by reference in its entirety.

TECHNICAL FIELD

The present disclosure relates to a semiconductor device and a method for fabricating the semiconductor device, and more particularly, to a semiconductor device with an assisting layer and a method for fabricating the semiconductor device with the assisting layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a first insulating layer inwardly positioned in the substrate and including a U-shaped cross-sectional profile; a first assisting layer conformally positioned on the first insulating layer and the substrate; a first filler layer positioned on the first assisting layer; and a capping dielectric layer positioned on the substrate and covering the first assisting layer and the first filler layer. A top surface of the first insulating layer is at a vertical level lower than a top surface of the substrate. The first assisting layer includes a first step portion and a second step portion, the first step portion of the first assisting layer is positioned adjacent to the top surface of the first insulating layer, and the second step portion of the first assisting layer is positioned adjacent to the top surface of the substrate.

In some embodiments, the first assisting layer comprises manganese.

Another aspect of the present disclosure provides a semiconductor device including a substrate; a first insulating layer inwardly positioned in the substrate and including a U-shaped cross-sectional profile; a first assisting layer conformally positioned on the first insulating layer and the substrate; a conductive structure including: a bottom interconnector layer positioned on the first assisting layer, a first liner layer conformally positioned on the bottom interconnector layer and the first assisting layer, and a top interconnector layer positioned on the first liner layer; and a capping dielectric layer positioned on the substrate and covering the first assisting layer and the conductive structure. A top surface of the first insulating layer is at a vertical level lower than a top surface of the substrate. The first assisting layer includes a first step portion and a second step portion, the first step portion of the first assisting layer is positioned adjacent to the top surface of the first insulating layer, and the second step portion of the first assisting layer is positioned adjacent to the top surface of the substrate.

Another aspect of the present disclosure provides a method for fabricating a semiconductor device including providing a substrate; forming a first trench in the substrate; conformally forming a first insulating layer in the first trench; conformally forming a first assisting layer on the first insulating layer and the substrate; forming a first filler layer on the first assisting layer; and forming a capping dielectric layer on the substrate and covering the first assisting layer and the first filler layer. A top surface of the first insulating layer is at a vertical level lower than a top surface of the substrate. The first assisting layer includes a first step portion and a second step portion, the first step portion of the first assisting layer is adjacent to the top surface of the first insulating layer, and the second step portion of the first assisting layer is adjacent to the top surface of the substrate.

Due to the design of the semiconductor device of the present disclosure, the first assisting layer formed of manganese may prevent metal ion diffusion to the substrate. As a result, the electron migration of the resulting semiconductor device may be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
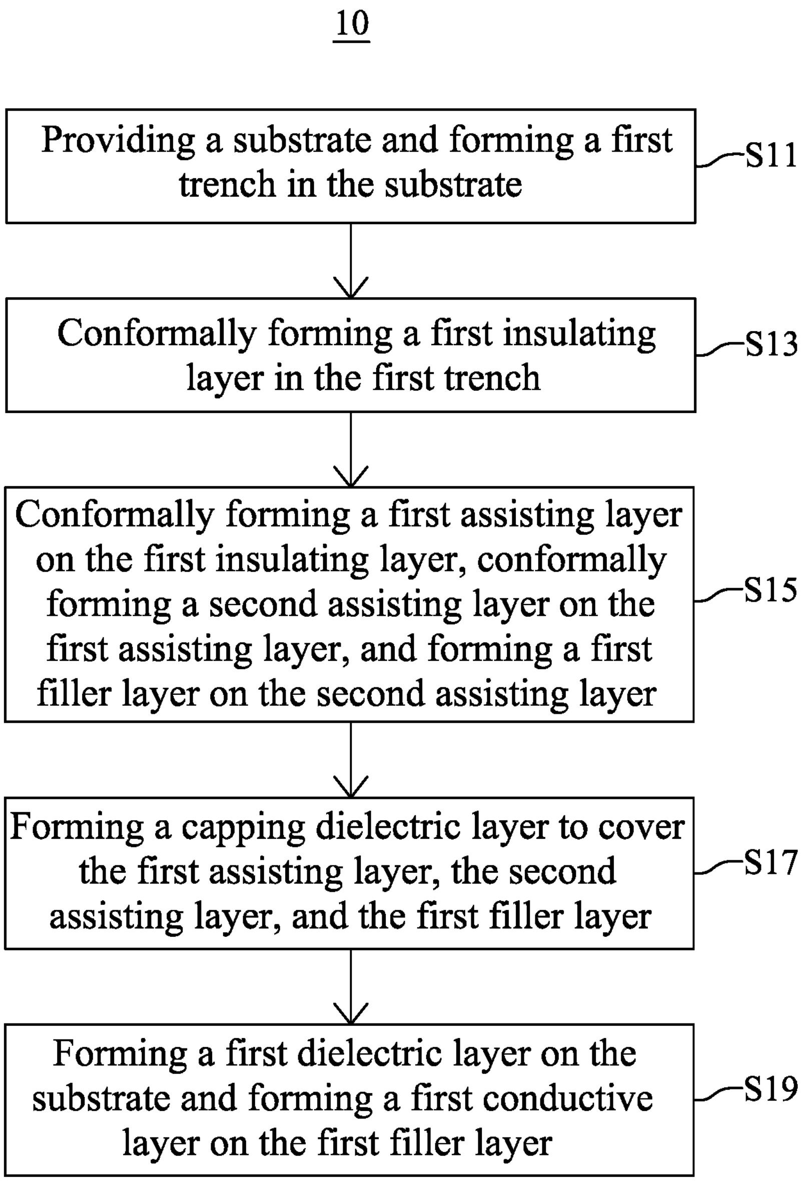
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1A in accordance with one embodiment of the present disclosure. FIGS. 2 to 17 illustrate, in schematic cross-sectional view diagrams, a flow for fabricating the semiconductor device 1A in accordance with one embodiment of the present disclosure.

Figure 2:
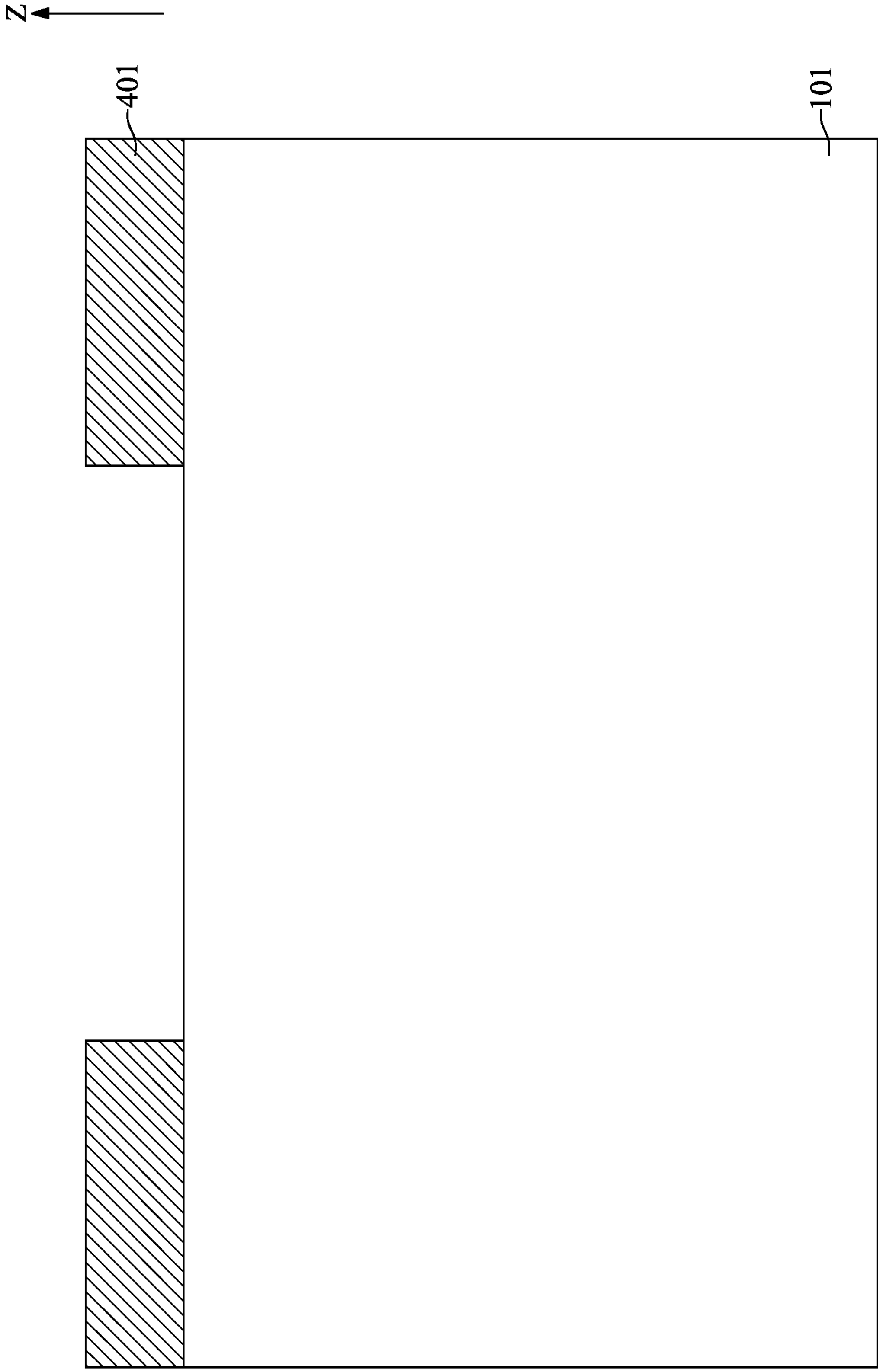
FIGS. 2 to 17 illustrate, in schematic cross-sectional view diagrams, a flow for fabricating the semiconductor device in accordance with one embodiment of the present disclosure.
Figure 3:
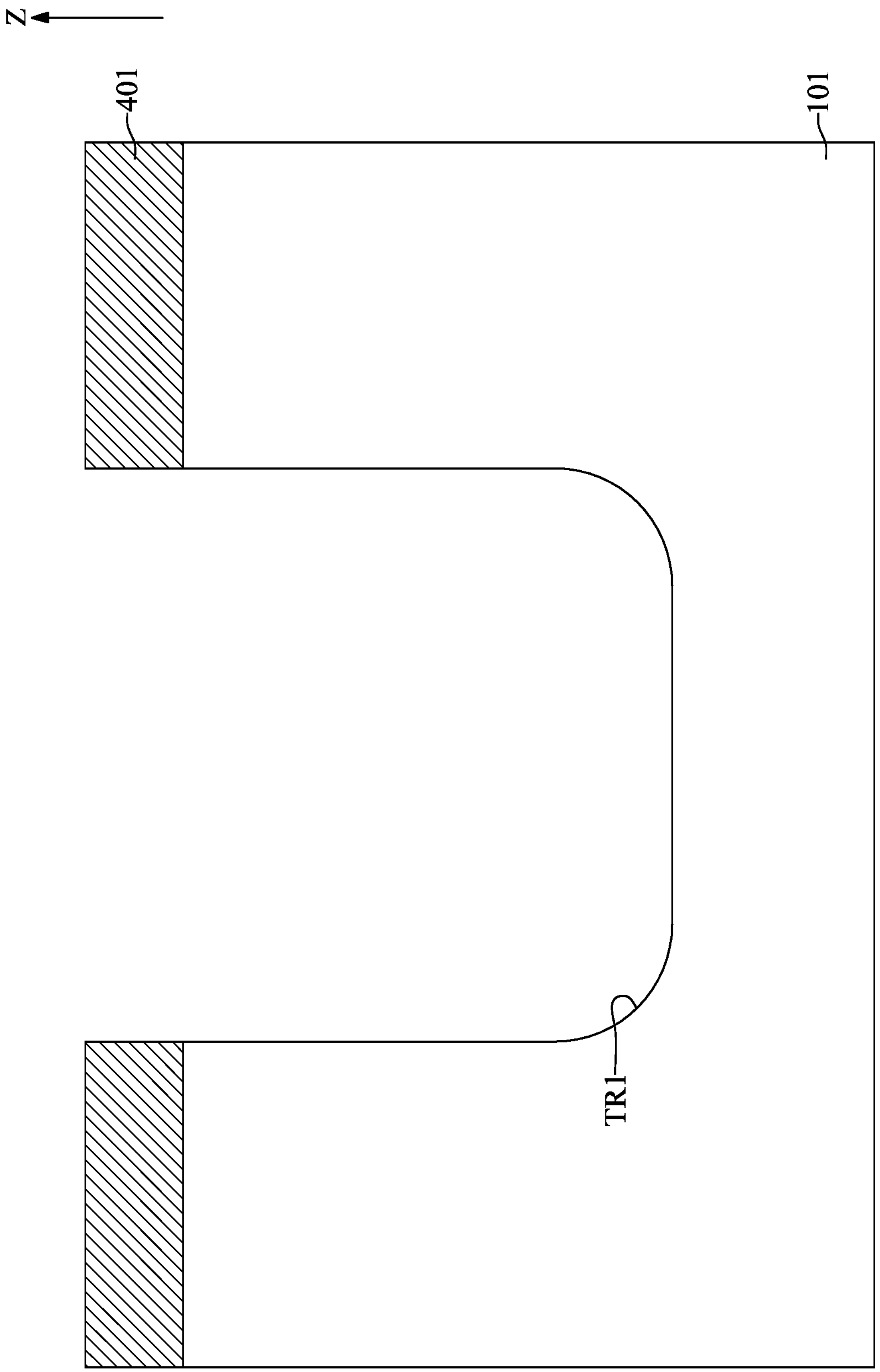

With reference to FIGS. 1 to 3, at step S11, a substrate 101 may be provided and a first trench TR1 may be formed in the substrate 101.

With reference to FIG. 2, the substrate 101 may include a bulk semiconductor substrate that is composed of at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and about 200 nm. The insulator layer may eliminate leakage current between adjacent elements in the substrate 101 and reduce parasitic capacitance associated with source/drains.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent errors in measuring procedures, differences in the manufacture, source, or purity of the ingredients employed to make the compositions or carry out the methods, and the like. In one aspect, the term "about" means within 10% of the reported numerical value. In another aspect, the term “about” means within 5% of the reported numerical value. Yet, in another aspect, the term “about” means within 10, 9, 8, 7, 6, 5, 4, 3, 2, or 1% of the reported numerical value.

With reference to FIG. 2, a first mask layer 401 may be deposited over the substrate 101. In some embodiments, the first mask layer 401 may be deposited by performing a spin coating process on the substrate 101. The first mask layer 401 may be configured to be a mask layer to prevent the underneath layer from the following etching process. The first mask layer 401 may be patterned by performing a photolithography process. The first mask layer 401 may be exposed to process light according to a mask (not shown in FIG. 2). A wavelength of the process light may be associated with the critical dimension of the first trench TR1. In some embodiments, the process light may be a deep ultraviolet (DUV). In some embodiments, the process light may be an extreme ultraviolet (EUV), and the photolithography process may be an EUV lithography. After exposing the process light, a pattern on the mask is converted to the first mask layer 401. The first mask layer 401 may be then etched according to the converted pattern so as to form the pattern on the first mask layer 401.

With reference to FIG. 3, a portion of the substrate 101 may be etched according to the first mask layer 401 to form the first trench TR1. In some embodiments, the substrate 101 may be etched by performing a dry etch process such as a reactive ion etching (RIE). The first mask layer 401 may be removed and the first trench TR1 may be formed.

With reference to FIG. 1 and FIGS. 4 to 7, at step S13, a first insulating layer 210 may be conformally formed in the first trench TR1.

Figure 4:
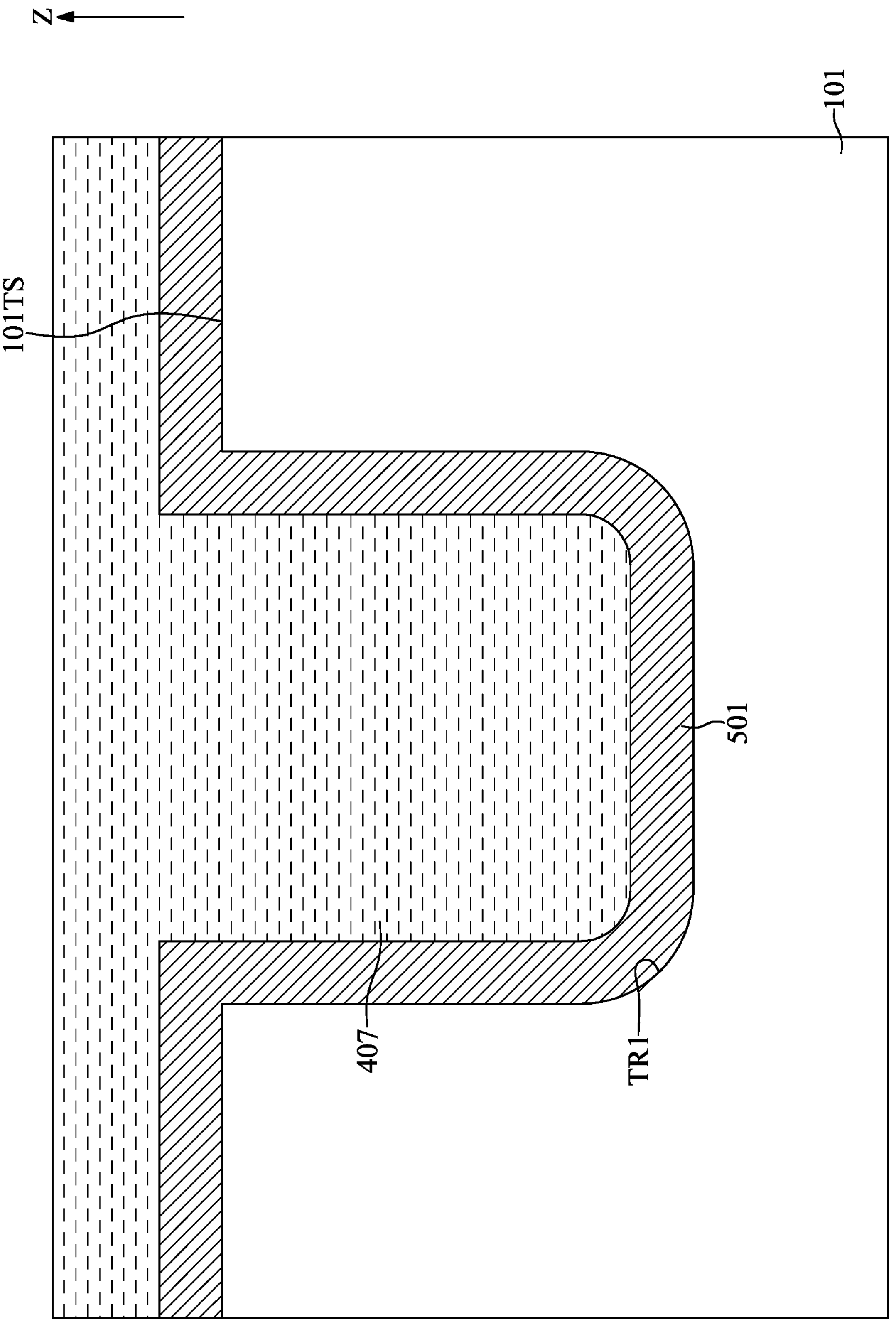

With reference to FIG. 4, a layer of first insulating material 501 may be conformally formed in the first trench TR1 and on the top surface 101TS of the substrate 101. In some embodiments, the layer of first insulating material 501 may have a thickness in a range of about 1 nm to about 7 nm, including about 1 nm, about 2 nm, about 3 nm, about 4 nm, about 5 nm, about 6 nm, or about 7 nm. In some embodiments, the first insulating material 501 may be, for example, high-k material, an oxide, a nitride, an oxynitride or combinations thereof. In some embodiments, the layer of first insulating material 501 may be formed by a thermal oxidation process. For example, the layer of first insulating material 501 may be formed by oxidizing the surface of the first trench TR1 and the top surface 101TS of the substrate 101. In some embodiments, the layer of first insulating material 501 may be formed by a deposition process such as a chemical vapor deposition or an atomic layer deposition. In some embodiments, after a liner polysilicon layer (not shown for clarity) is deposited, the layer of first insulating material 501 may be formed by radical-oxidizing the liner polysilicon layer. In some embodiments, after a liner silicon nitride layer (not shown for clarity) is formed, the layer of first insulating material 501 may be formed by radical-oxidizing the liner silicon nitride layer.

In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide, or a combination thereof.

With reference to FIG. 4, a first sacrificial layer 407 may be deposited over the layer of first insulating material 501. The first sacrificial layer 407 may have a T-shape to fill the first trench TR1 and may cover the layer of first insulating material 501. In some embodiments, the first sacrificial layer 407 may include a material having etching selectivity to the first insulating material 501. In some embodiments, the first sacrificial layer 407 may be a photoresist layer.

Figure 5:
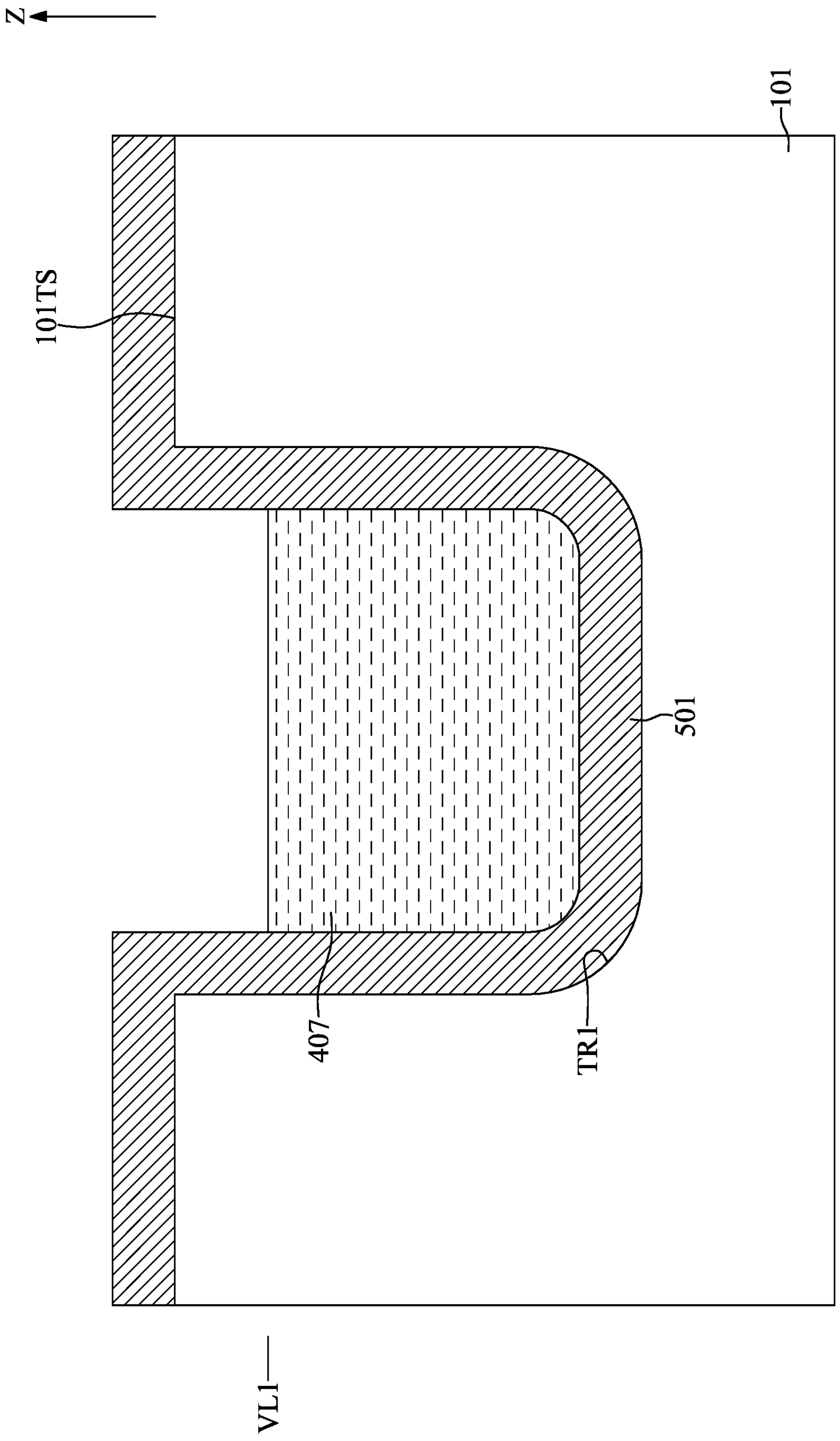

With reference to FIG. 5, in some embodiments, the sacrificial first sacrificial layer 407 may be etched to form a recess. Detailedly, the first sacrificial layer 407 may be etched to a vertical level VL1 lower than the top surface 101TS of the substrate 101. In some embodiments, a planarization process may be performed until the top surface 101TS of the substrate 101 is exposed to remove excess material and provide a substantially flat surface for subsequent processing steps. Then, a recessing process may be performed to remove portions of the first sacrificial layer 407. In some embodiments, the etch rate ratio of the first sacrificial layer 407 to the first insulating material 501 may be between about 100:1 and about 1.05:1, between about 15:1 and about 2:1, or between about 10:1 and about 2:1 during the recessing process.

Figure 6:
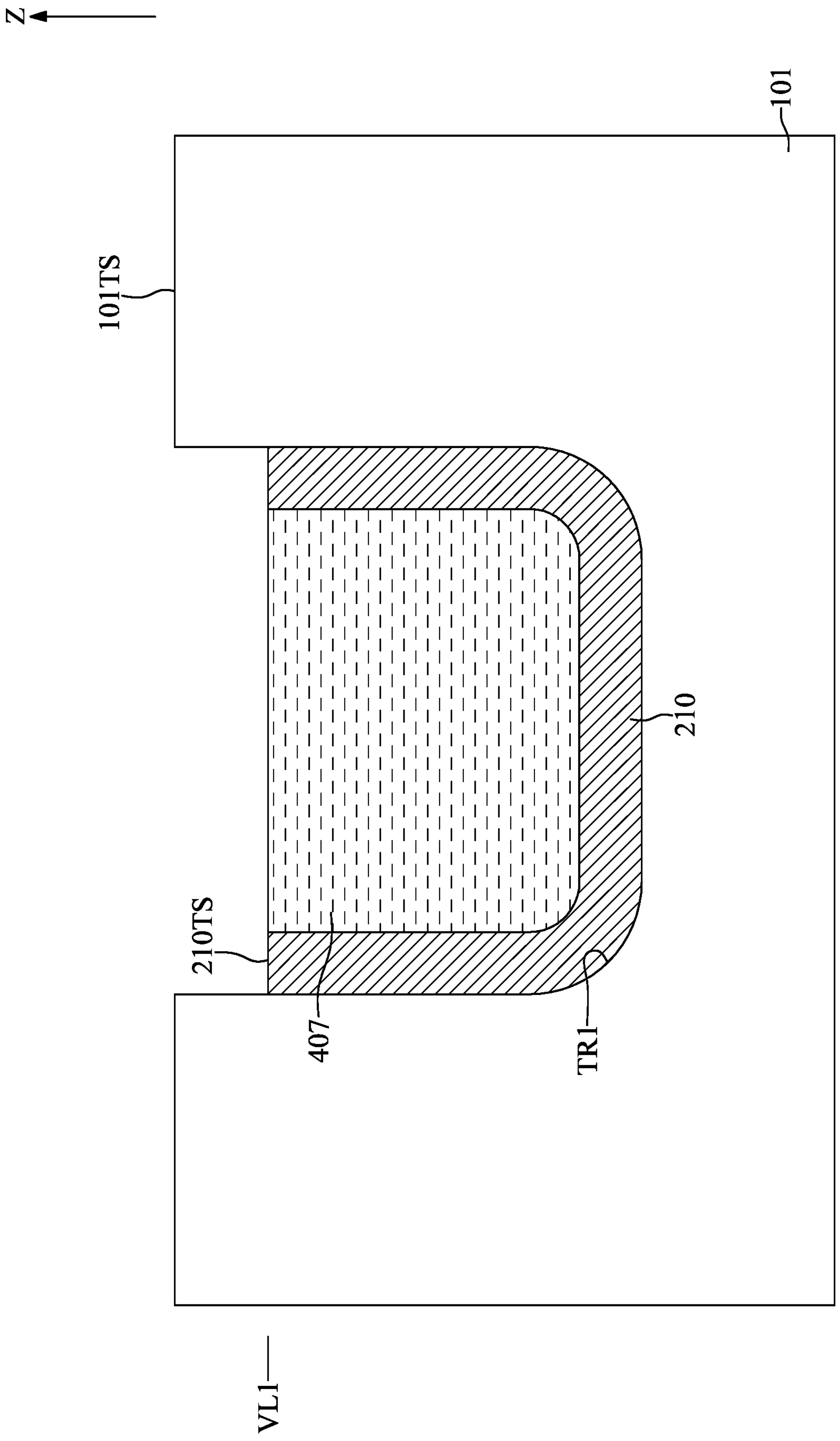

With reference to FIG. 6, an etching back process may be performed to remove portions of the first insulating material 501. In some embodiments, the etch rate ratio of the first insulating material 501 to the first sacrificial layer 407 may be between about 100:1 and about 1.05:1, between about 15:1 and about 2:1, or between about 10:1 and about 2:1 during the etching back process. In some embodiments, the etch rate ratio of the first insulating material 501 to the substrate 101 may be between about 100:1 and about 1.05:1, between about 15:1 and about 2:1, or between about 10:1 and about 2:1 during the etching back process. After the etching back process, the remaining first insulating material 501 may be referred to as the first insulating layer 210. The top surface 210TS of the first insulating layer 210 may be at the vertical level VL1 lower than the top surface 101TS of the substrate 101.

Figure 7:
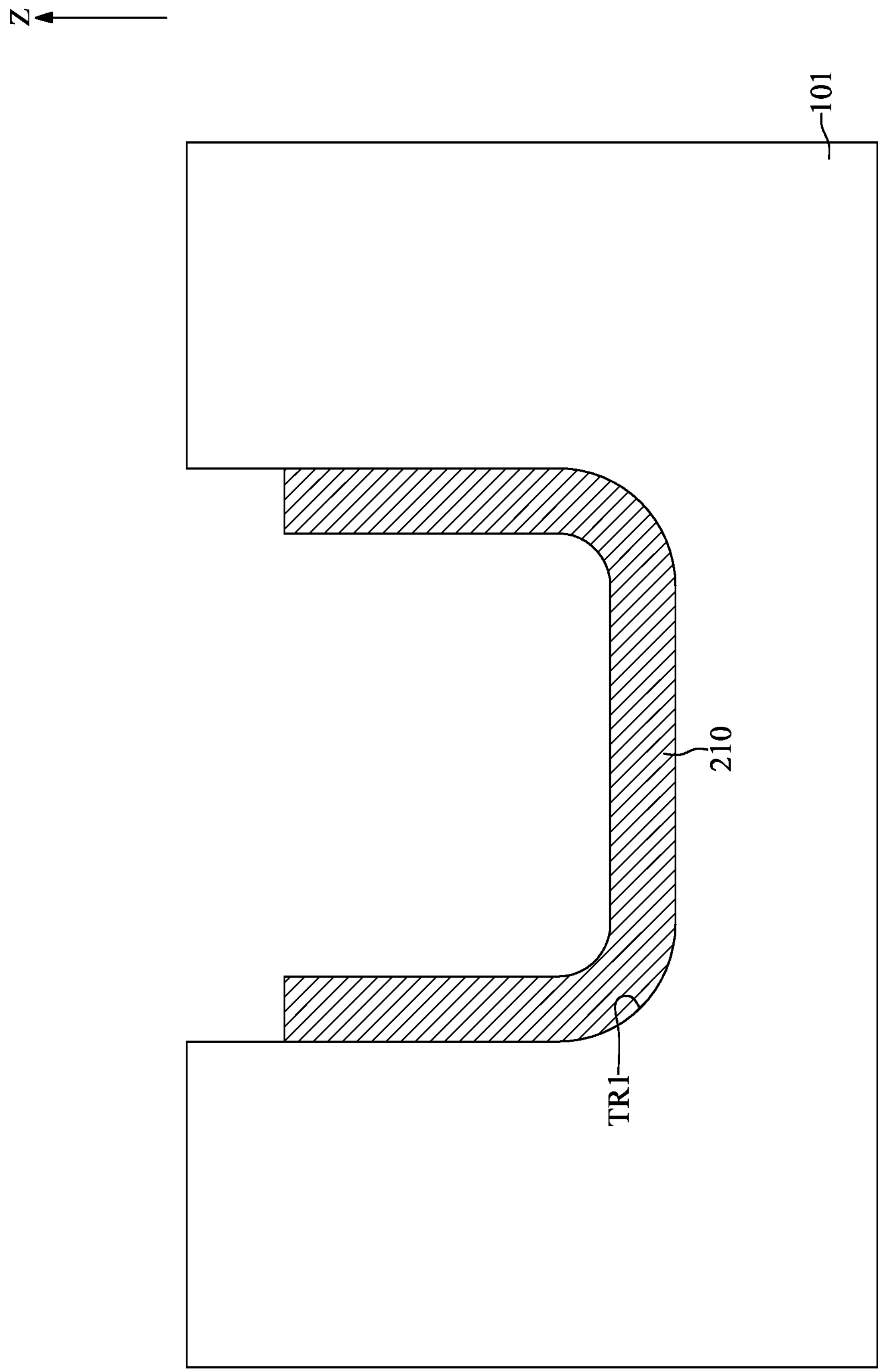

With reference to FIG. 7, a removal process may be performed to completely remove the first sacrificial layer 407. In some embodiments, the removal process may be an ashing process when the first sacrificial layer 407 is a photoresist layer. In some embodiments, the removal process may be an etching process such as a wet etching process. In some embodiments, the removal rate ratio of the first sacrificial layer 407 to the first insulating layer 210 may be between about 100:1 and about 1.05:1, between about 15:1 and about 2:1, or between about 10:1 and about 2:1 during the removal process. In some embodiments, the removal rate ratio of the first sacrificial layer 407 to the substrate 101 may be between about 100:1 and about 1.05:1, between about 15:1 and about 2:1, or between about 10:1 and about 2:1 during the removal process.

With reference to FIG. 1 and FIGS. 8 to 13, at step S15, a first assisting layer 220 may be conformally formed on the first insulating layer 210, a second assisting layer 230 may be conformally formed on the first assisting layer 220, and a first filler layer 240 may be formed on the second assisting layer 230.

Figure 8:
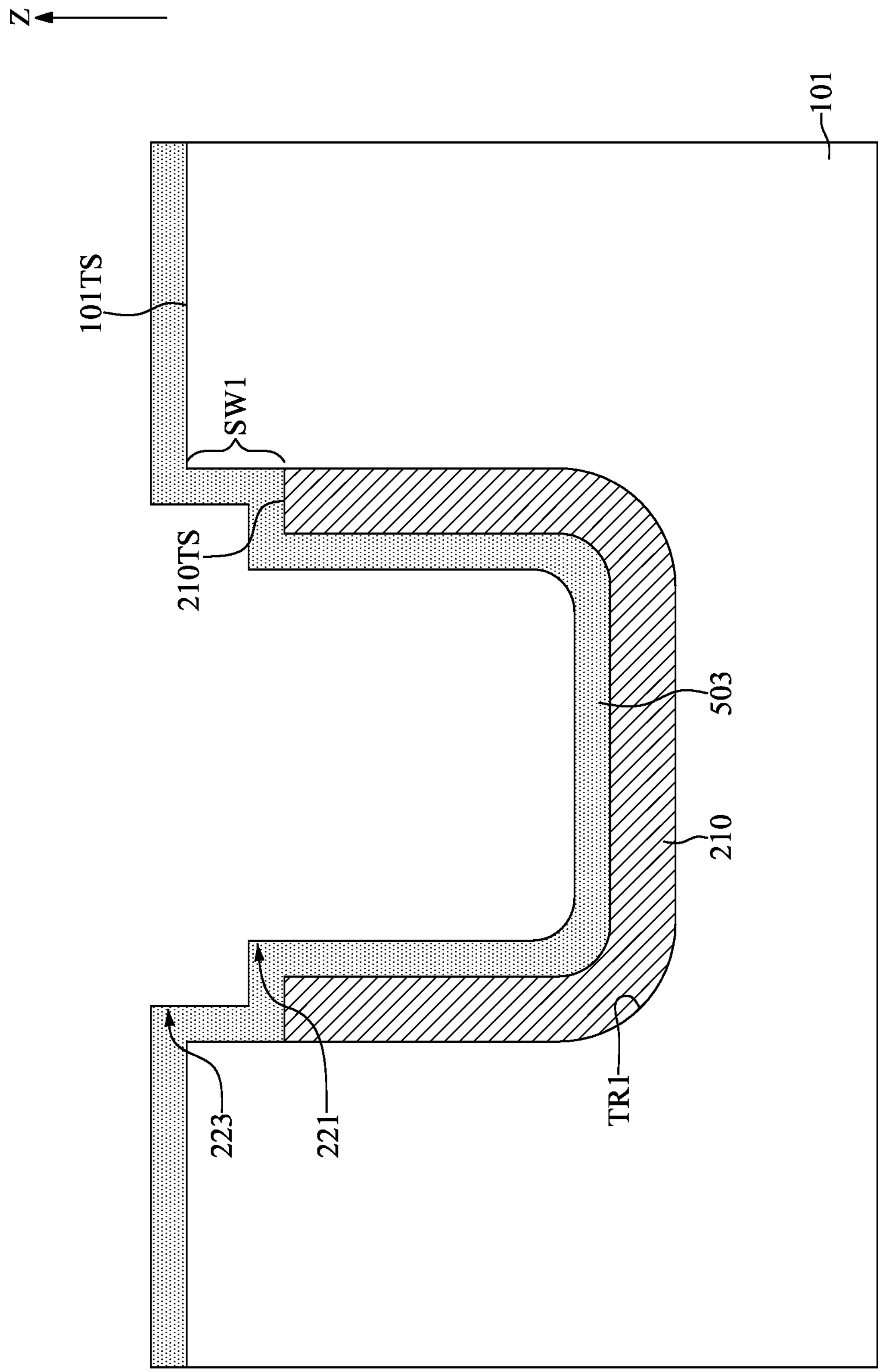

With reference to FIG. 8, a layer of first assisting material 503 may be conformally formed on the first insulating layer 210, on the exposed portion SW1 of the first trench TR1, and on the top surface 101TS of the substrate 101. In some embodiments, the layer of first assisting material 503 may include a first step portion 221 and a second step portion 223. The first step portion 221 may be formed adjacent to the top surface 210TS of the first insulating layer 210. The second step portion 223 may be formed adjacent to the corner configured by the exposed portion SW1 of the first trench TR1 and the top surface 101TS of the substrate 101. In some embodiments, the first assisting material 503 may be, for example, manganese. The layer of first assisting material 503 may be formed by, for example, atomic layer deposition or other applicable deposition process.

Figure 9:
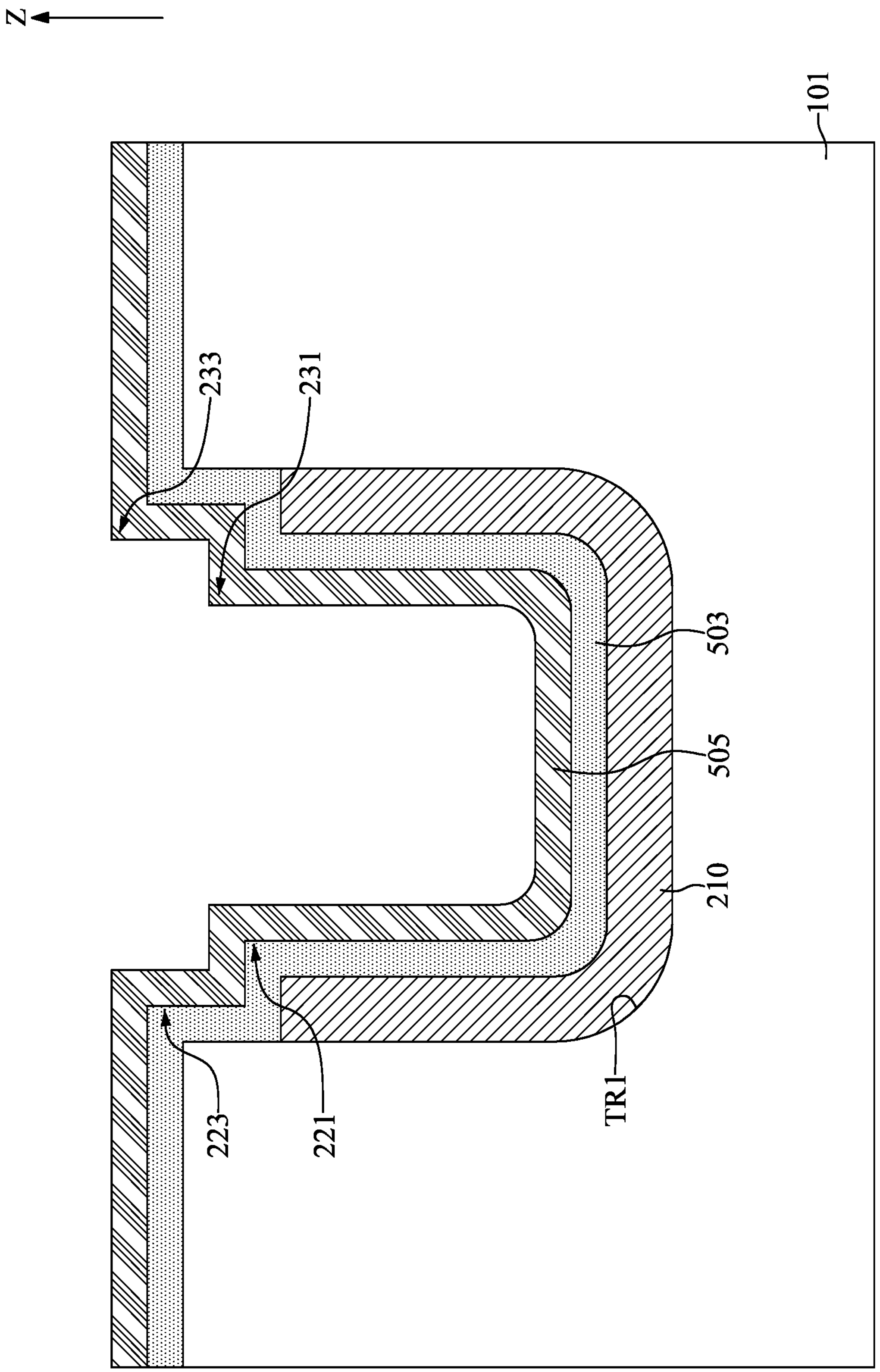

With reference to FIG. 9, a layer of second assisting material 505 may be conformally formed on the layer of first assisting material 503. In some embodiments, the layer of second assisting material 505 may include a first step portion 231 and a second step portion 233. The first step portion 231 may cover the first step portion 221. The second step portion 233 may cover the second step portion 223. In some embodiments, the second assisting material 505 may be, for example, titanium silicon nitride. In some embodiments, the titanium content in the second assisting material 505 may be about 10 to 40 atomic percent. The silicon content in the second assisting material 505 may be about 10 to 40 atomic percent. The nitrogen content in the second assisting material 505 may be about 25 to 47 atomic percent.

In some embodiments, the layer of second assisting material 505 may be formed by a thermal chemical vapor deposition process. During the thermal chemical vapor deposition process, a titanium-containing gas, a silicon-containing gas, and a nitrogen-containing gas may be introduced to the layer of first assisting material 503 to form a titanium silicon nitride film (i.e., the layer of second assisting material 505). The titanium-containing gas may be, for example, tetraxydimethylaminotitanium or tetraxydiethylaminotitanium. The silicon-containing gas may be, for example, $SiH_2Cl_2$, $SiHCl_3$, $SiCl_4$, $SiH_4$, or $Si_2H_6$. The nitrogen-containing gas may be, for example, ammonia or monomethylhydrazine. The flow rate of the titanium-containing gas may be between about 5 standard cubic centimeters per minute (sccm) and about 50 sccm. The flow rate of the silicon-containing gas may be between about 5 sccm and about 500 sccm. The flow rate of the nitrogen-containing gas may be between about 50 sccm and about 500 sccm. The process pressure of the thermal chemical vapor deposition process may be between about 0.3 Torr and about 5 Torr. The process temperature may be between about 400° C. and about 650° C.

Alternatively, in some embodiments, the layer of second assisting material 505 may be formed by a plasma chemical vapor deposition process. The gas for generating plasma may be, for example, hydrogen and argon. The frequency of radio-frequency power of the plasma may be 13.56 MHz. The radio-frequency power of the plasma may be between about 200 W and about 800 W. The flow rate of the titanium-containing gas (e.g., $TiCl_4$) may be between about 1 sccm and about 10 sccm. The flow rate of the silicon-containing gas (e.g., $SiH_4$) may be between about 0.1 sccm and about 10 sccm. The flow rate of the nitrogen-containing gas ($N_2$) may be between about 30 sccm and about 500 sccm. The flow rate of hydrogen may be between about 100 and 3000 sccm. The flow rate of argon may be between about 100 and 2000 sccm. The process pressure of the plasma chemical vapor deposition process may be between about 0.5 Torr and about 5 Torr. The process temperature may be between about 350° C. and about 450° C.

Alternatively, in some embodiments, a layer of titanium nitride and a layer of silicon nitride may be sequentially formed on the layer of first assisting material 503. An annealing process may be performed to turn the layer of titanium nitride and the layer of silicon nitride into a titanium silicon nitride film (i.e., the layer of second assisting material 505).

Figure 10:
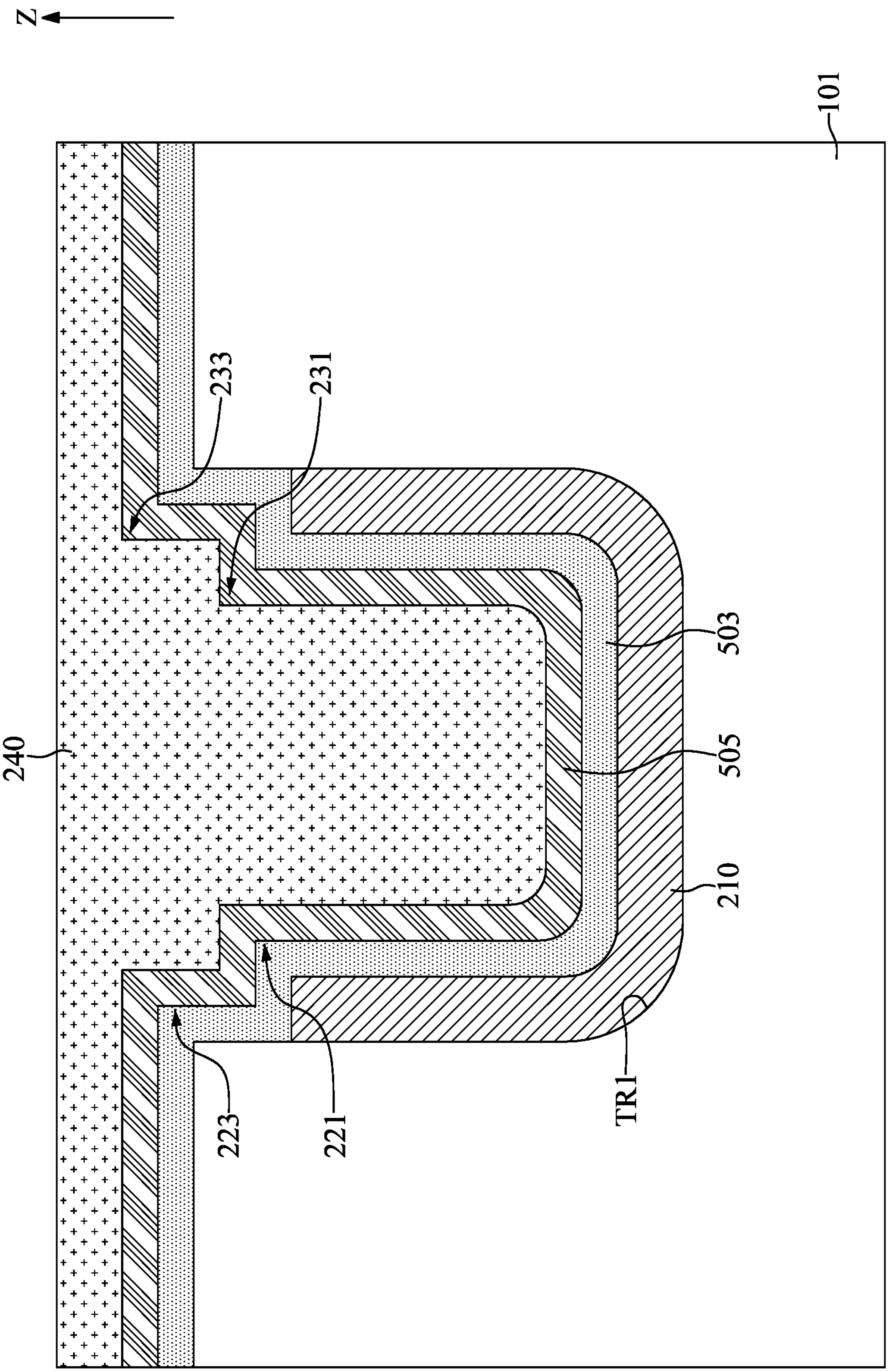

With reference to FIG. 10, a first filler layer 240 may be formed on the layer of second assisting material 505 and completely fill the first trench TR1. State differently, the first filler layer 240 may have a T-shaped cross-sectional profile in the current stage. In some embodiments, the first filler layer 240 may be formed of, for example, aluminum, tungsten, copper, or a combination thereof. In some embodiments, the first filler layer 240 may be formed by, for example, chemical vapor deposition, physical vapor deposition, electroplating, electroless plating, or other applicable deposition process.

Figure 11:
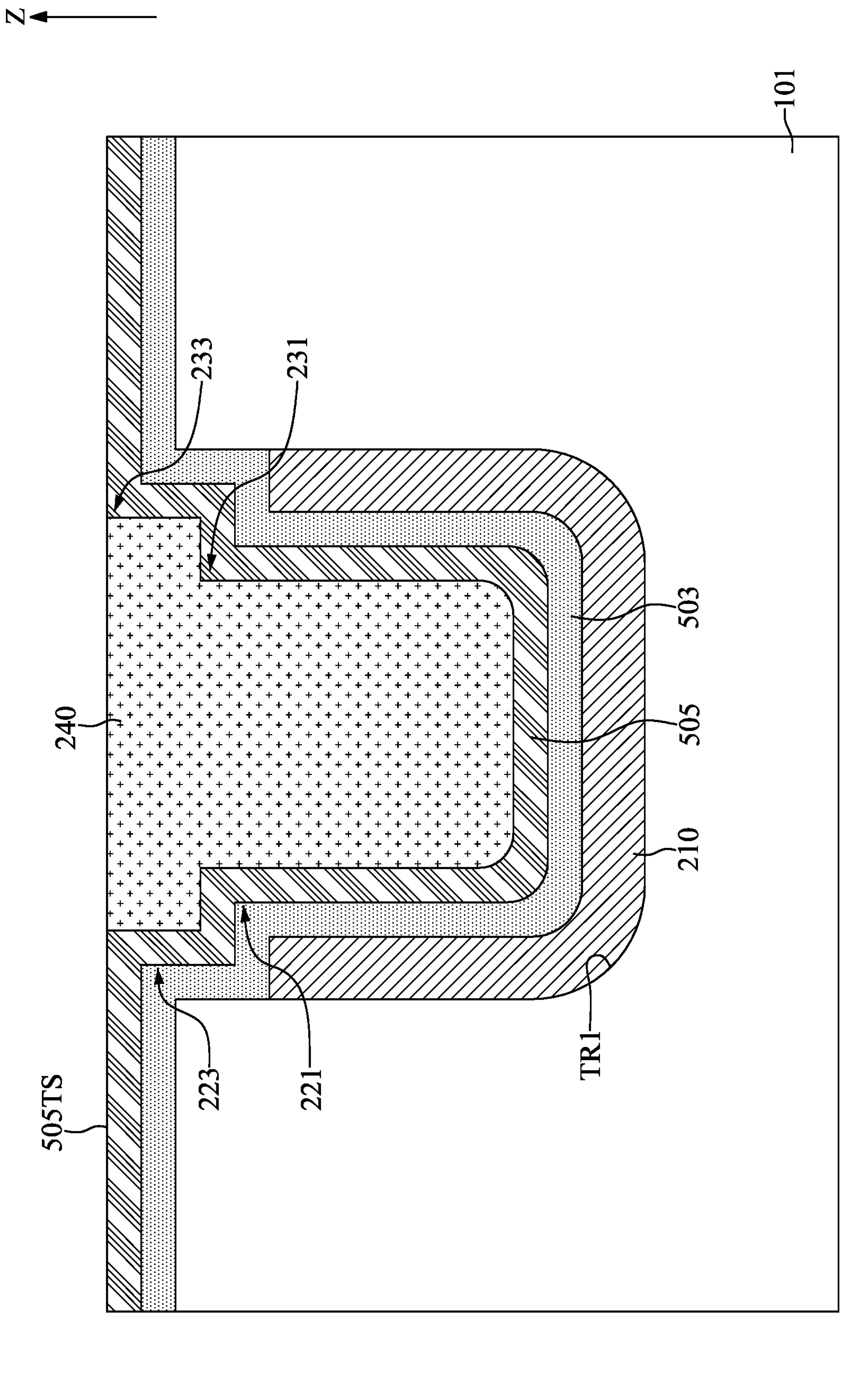

With reference to FIG. 11, a planarization process, such as chemical mechanical polishing, may be performed until the top surface 505TS of the layer of second assisting material 505 is exposed to remove excess material and provide a substantially flat surface for subsequent processing steps.

Figure 12:
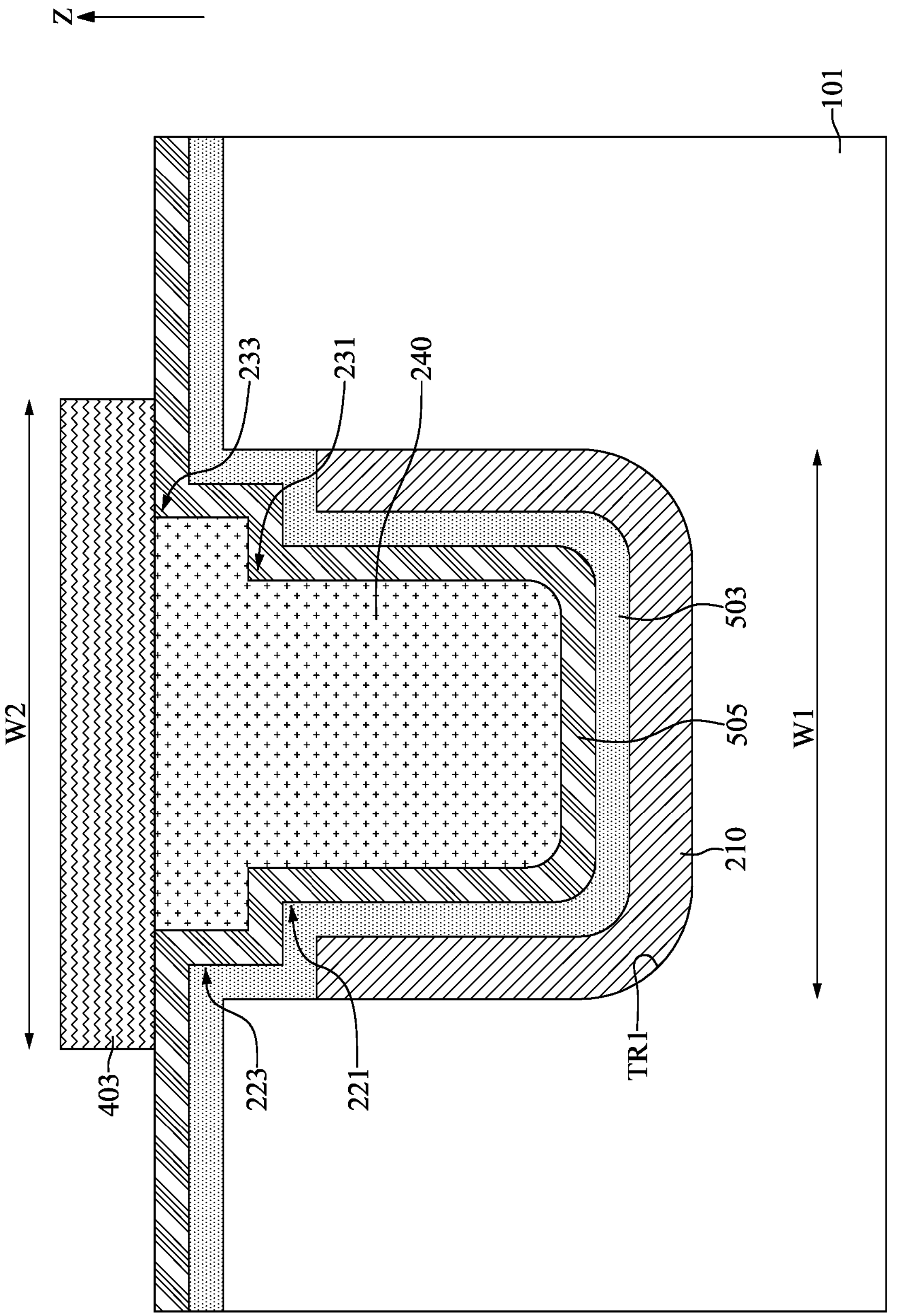

With reference to FIG. 12, a second mask layer 403 may be formed on the first filler layer 240 and cover a portion of the layer of second assisting material 505. The width W1 of the first insulating layer 210 may be less than the width W2 of the second mask layer 403. In some embodiments, the second mask layer 403 may be a photoresist layer. The pattern of the second mask layer 403 may be formed with a procedure similar to the first mask layer 401 illustrated in FIG. 2, and descriptions thereof are not repeated herein.

Figure 13:
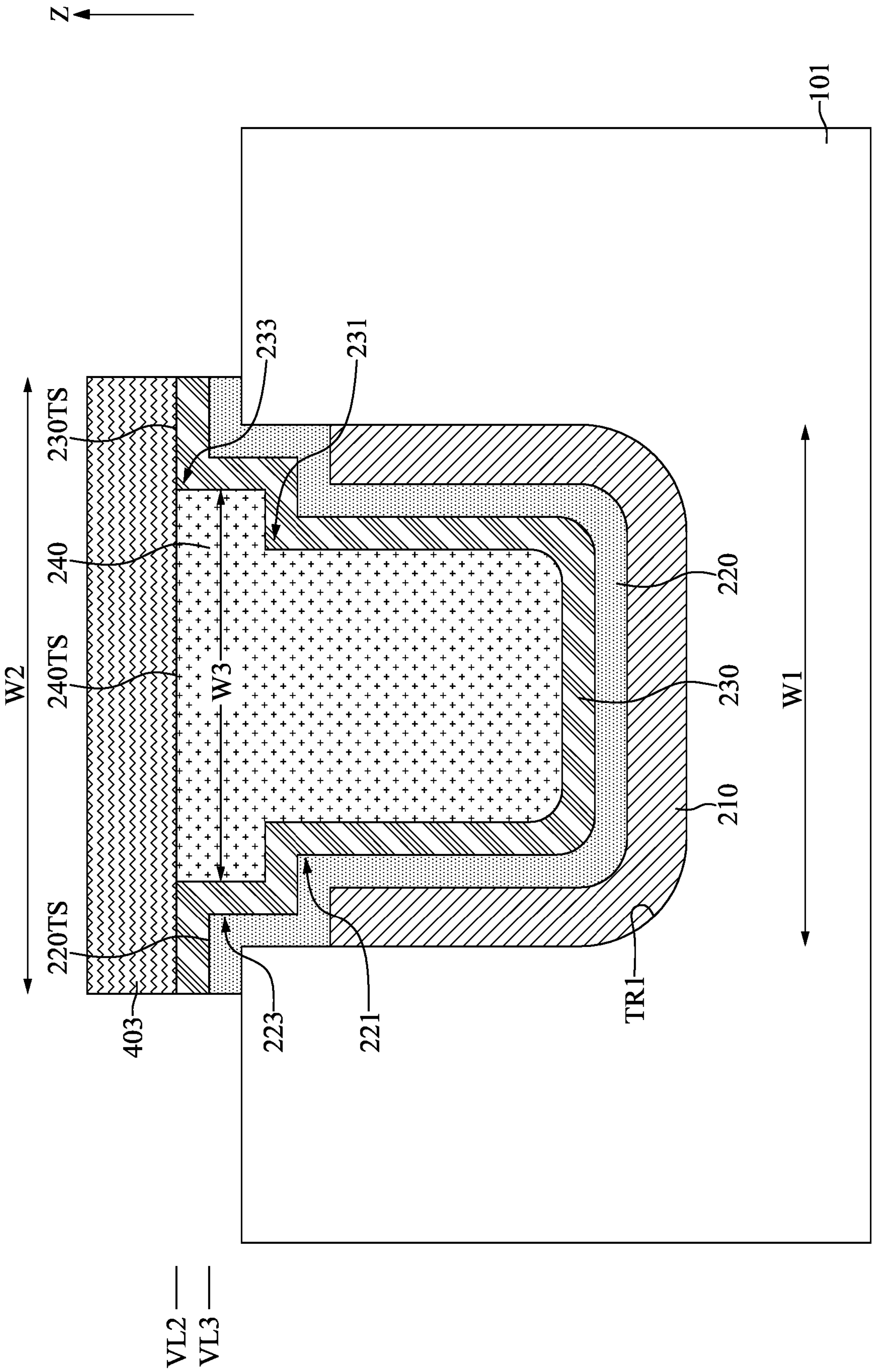

With reference to FIG. 13, an etching process may be performed to remove portions of the second assisting material 505 and the first assisting material 503. The etching process may be a multi-staged etching process. For example, the etching process may be a two-staged anisotropic dry etching process. The etching chemistry may be different for each stage to provide different etching selectivity. In some embodiments, the etch rate ratio of the second assisting material 505 to the first assisting material 503 may be between about 100:1 and about 1.05:1, between about 15:1 and about 2:1, or between about 10:1 and about 2:1 during the first stage of the etching process. In some embodiments, the etch rate ratio of the first assisting material 503 to the second assisting material 505 may be between about 100:1 and about 1.05:1, between about 15:1 and about 2:1, or between about 10:1 and about 2:1 during the second stage of the etching process. In some embodiments, the etch rate ratio of the first assisting material 503 to the substrate 101 may be between about 100:1 and about 1.05:1, between about 15:1 and about 2:1, or between about 10:1 and about 2:1 during the second stage of the etching process.

After the etching process, the remaining first assisting material 503 may be turned into the first assisting layer 220. The first assisting layer 220 may be conformally formed on the first insulating layer 210 and may include a U-shaped cross-sectional profile including the first step portion 221 and the second step portion 223. The remaining second assisting material 505 may be turned into the second assisting layer 230. The second assisting layer 230 may be conformally formed on the first assisting layer 220 and may include a U-shaped cross-sectional profile including the first step portion 231 and the second step portion 233. The top surface 230TS of the second assisting layer 230 and the top surface 240TS of the first filler layer 240 may be substantially coplanar. The top surface 230TS of the second assisting layer 230 or the top surface 240TS of the first filler layer 240 may be at a vertical level VL2 higher than a vertical level VL3 of the top surface 220TS of the first assisting layer 220. The second mask layer 403 may be removed after the first assisting layer 220 and the second assisting layer 230 are formed.

With reference to FIG. 13, in some embodiments, the first assisting layer 220 and the second assisting layer 230 may have the same width W2. In some embodiments, the width W1 of the first insulating layer 210 may be less than the width W2 of the first assisting layer 220 or less than the width W2 of the second assisting layer 230. In some embodiments, the width W3 of the first filler layer 240 may be less than the width W1 of the first insulating layer 210 or less than the width W2 of the first assisting layer 220.

Figure 14:
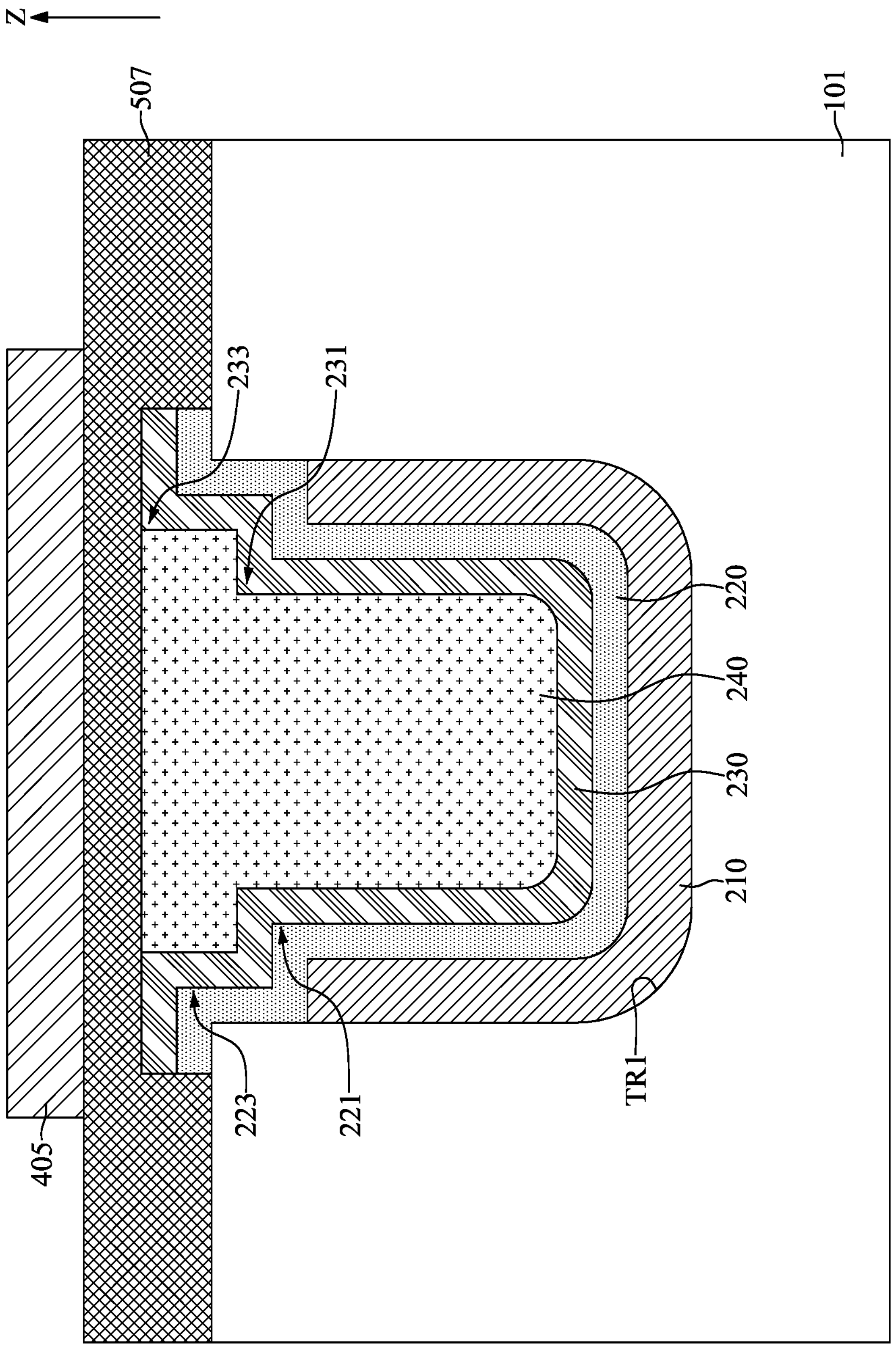
Figure 15:
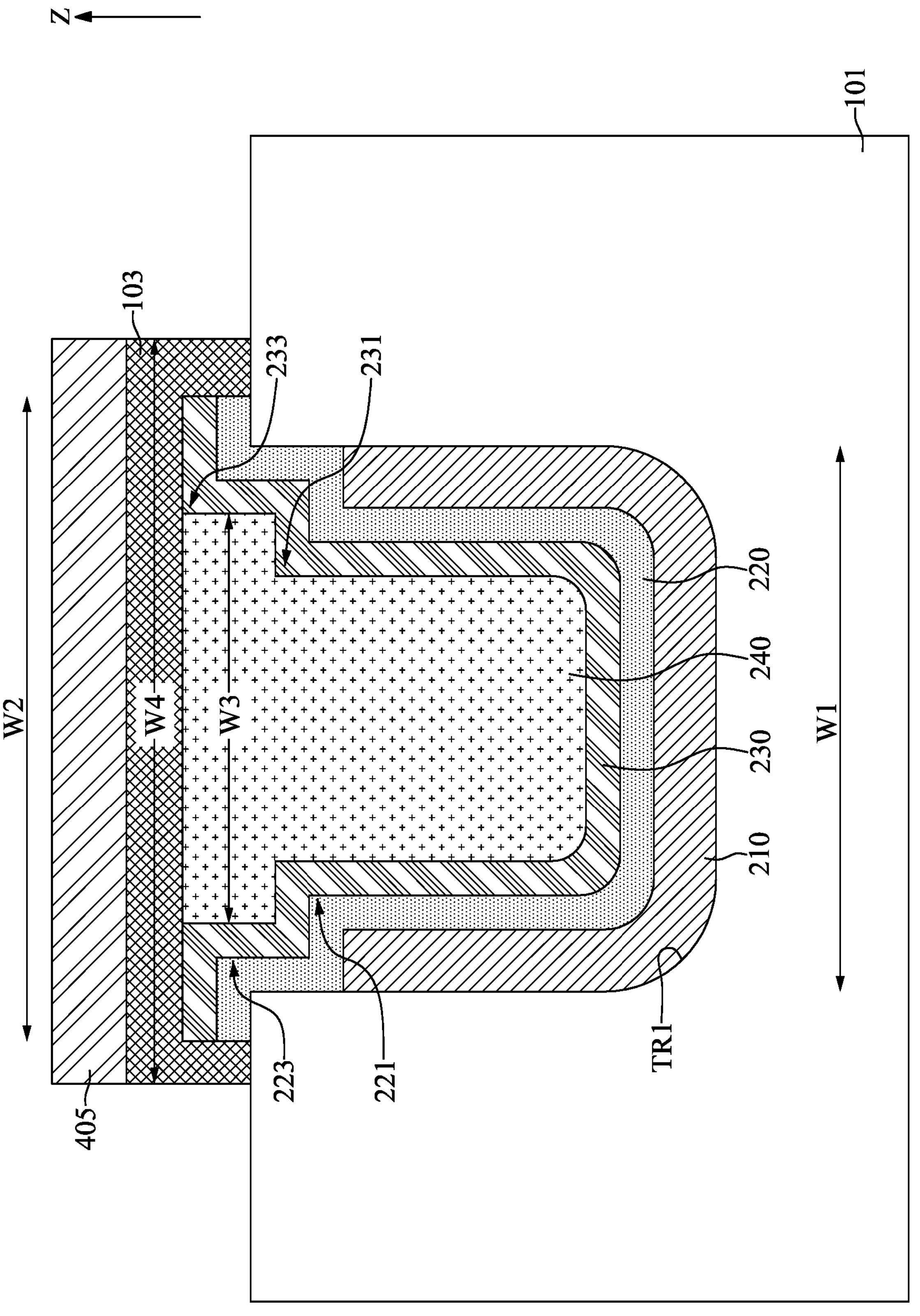

With reference to FIGS. 1, 14, and 15, at step S17, a capping dielectric layer 103 may be formed to cover the first assisting layer 220, the second assisting layer 230, and the first filler layer 240.

With reference to FIG. 14, a layer of second insulating material 507 may be formed to cover the first assisting layer 220, the second assisting layer 230, and the first filler layer 240. In some embodiments, the second insulating material 507 may be, for example, silicon oxide, silicon nitride, silicon oxynitride, silicon nitride oxide, or other applicable insulating materials.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 14, a third mask layer 405 may be formed on the layer of second insulating material 507. In some embodiments, the third mask layer 405 may be a photoresist layer and may include the pattern of the capping dielectric layer 103.

With reference to FIG. 15, an etching process may be performed using the third mask layer 405 as the mask to remove portions of the second insulating material 507. In some embodiments, the etch rate ratio of the second insulating material 507 to the substrate 101 may be between about 100:1 and about 1.05:1, between about 15:1 and about 2:1, or between about 10:1 and about 2:1 during the etching process. The remaining second assisting material 505 may be referred to as the capping dielectric layer 103. After the capping dielectric layer 103 is formed, the third mask layer 405 may be removed.

With reference to FIG. 15, in some embodiments, the width W4 of the capping dielectric layer 103 may be greater than the width W1 of the first insulating layer 210. In some embodiments, the width W4 of the capping dielectric layer 103 may be greater than the width W2 of the first assisting layer 220 or the second assisting layer 230. In some embodiments, the width W4 of the capping dielectric layer 103 may be greater than the width W3 of the first filler layer 240.

In some embodiments, the first insulating layer 210, the first assisting layer 220, the second assisting layer 230, the first filler layer 240, and the capping dielectric layer 103 may together configure a gate structure.

Figure 16:
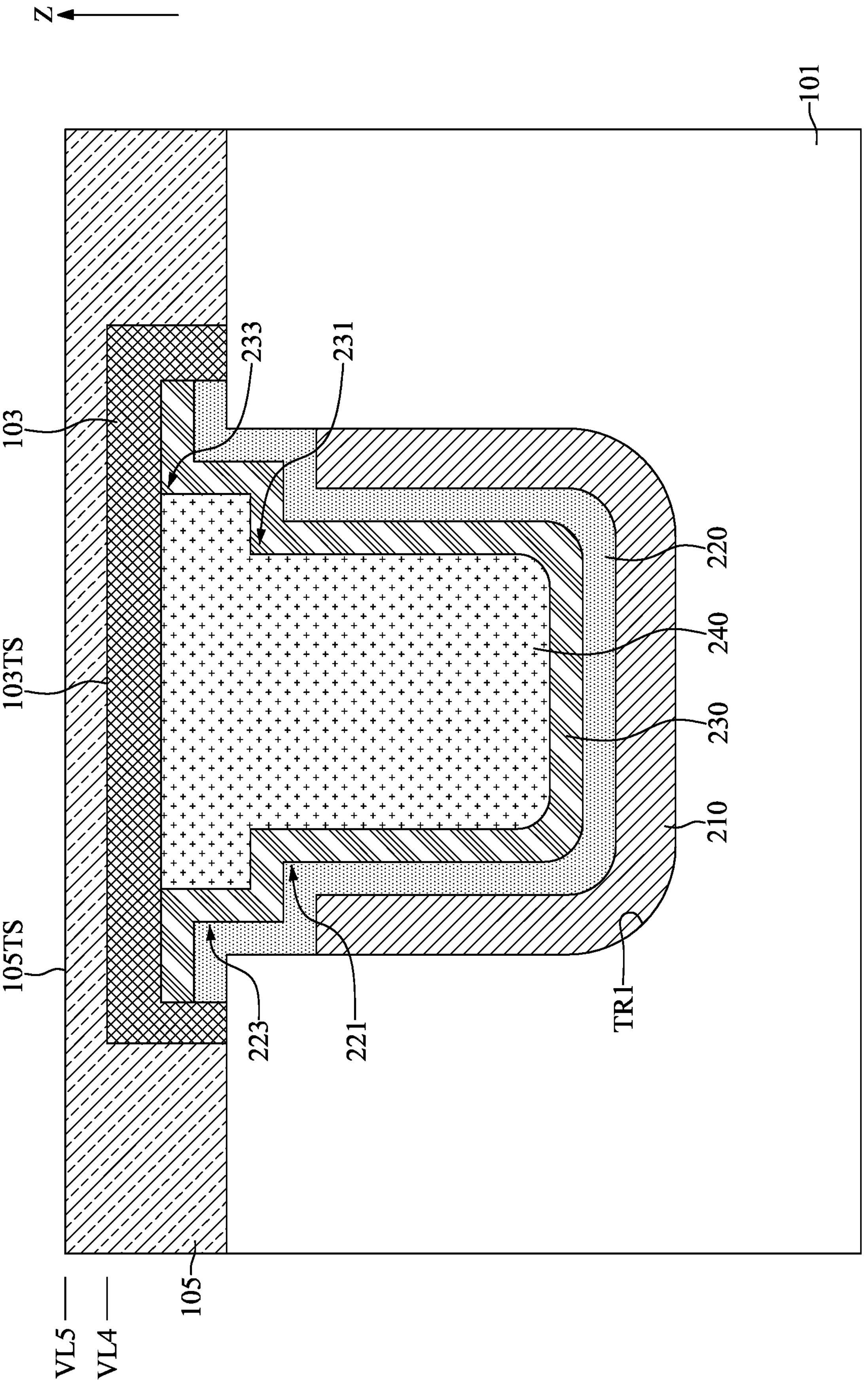
Figure 17:
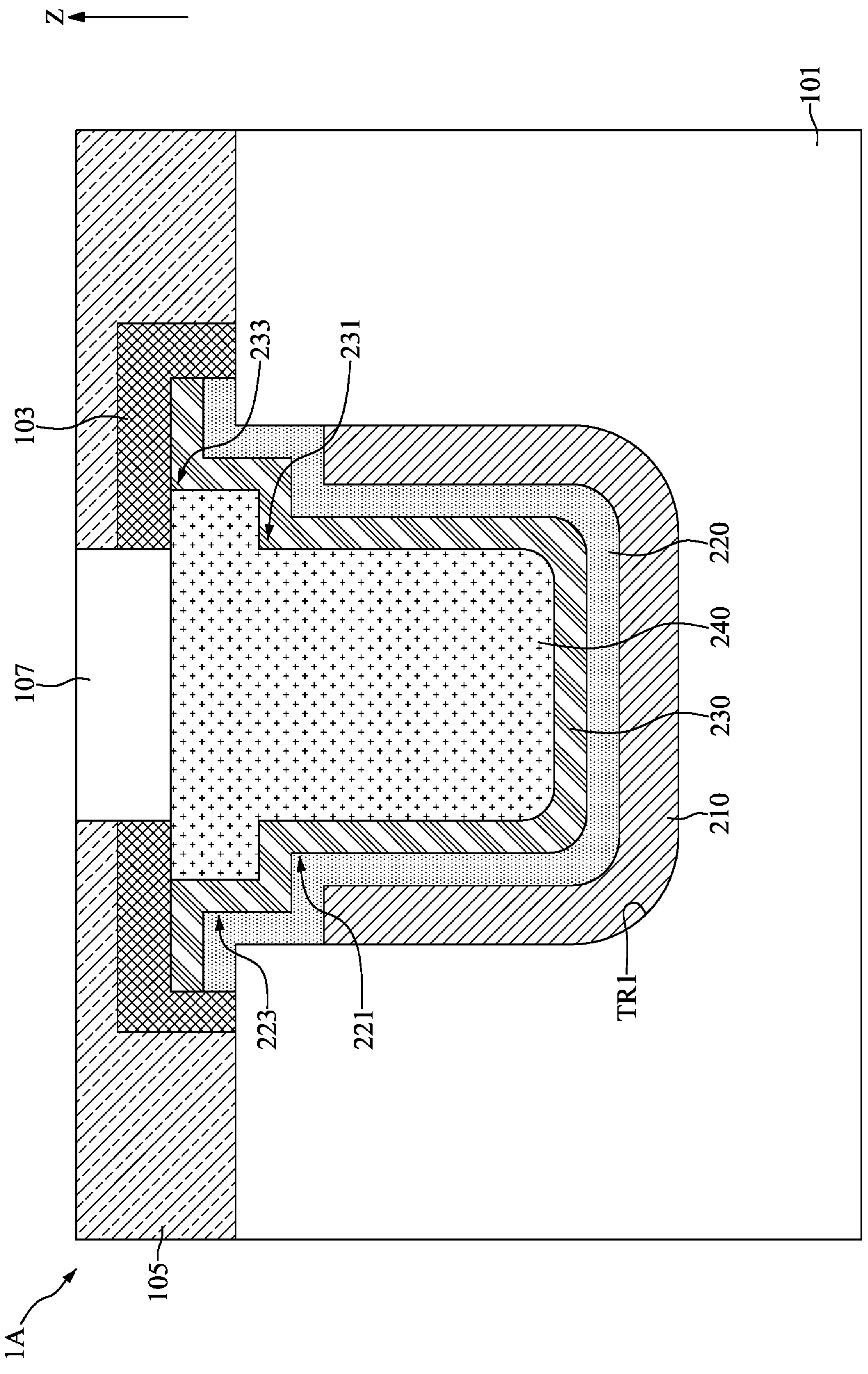

With reference to FIGS. 1, 16, and 17, at step S19, a first dielectric layer 105 may be formed on the substrate 101 and a first conductive layer 107 may be formed on the first filler layer 240.

With reference to FIG. 16, the first dielectric layer 105 may be formed on the substrate 101 and cover the capping dielectric layer 103. A planarization process, such as chemical mechanical polishing, may be performed to remove excess material and provide a substantially flat surface for subsequent processing steps. In some embodiments, the first dielectric layer 105 may be formed of the same material as the capping dielectric layer 103. In some embodiments, the first dielectric layer 105 may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. The term "low-k" as used throughout the present application denotes a dielectric material that has a dielectric constant of less than silicon dioxide. In some embodiments, the first dielectric layer 105 may include a self-planarizing material such as a spin-on glass or a spin-on low-k dielectric material such as SiLK™. The use of a self-planarizing dielectric material may avoid the need to perform a subsequent planarizing step. In some embodiments, the first dielectric layer 105 may be formed by a deposition process including, for example, chemical vapor deposition, plasma enhanced chemical vapor deposition, evaporation, or spin-on coating.

With reference to FIG. 16, in some embodiments, the top surface 103TS of the capping dielectric layer 103 may be at a vertical level VL4 lower than a vertical level VL5 of the top surface 105TS of the first dielectric layer 105. In some embodiments, the top surface 103TS of the capping dielectric layer 103 and the top surface 105TS of the first dielectric layer 105 may be substantially coplanar.

With reference to FIG. 17, a first conductive layer 107 may be formed along the first dielectric layer 105 and the capping dielectric layer 103 and formed on the first filler layer 240. In some embodiments, the first conductive layer 107 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The first conductive layer 107 may electrically couple the gate structure to other conductive features.

The first assisting layer 220 formed of manganese may prevent metal ion diffusion to the substrate 101. As a result, the electron migration of the resulting semiconductor device 1A may be reduced. In addition, the second assisting layer 230 including the titanium silicon nitride may have a low resistivity and an excellent barrier property and is stable under heat. Thus, the semiconductor device 1A including the second assisting layer 230 formed of titanium silicon nitride may have excellent characteristics. As a result, the performance of the resulting semiconductor device 1A may be improved.

FIGS. 18 to 29 illustrate, in schematic cross-sectional view diagrams, part of a flow for fabricating a semiconductor device 1B in accordance with another embodiment of the present disclosure.

Figure 18:
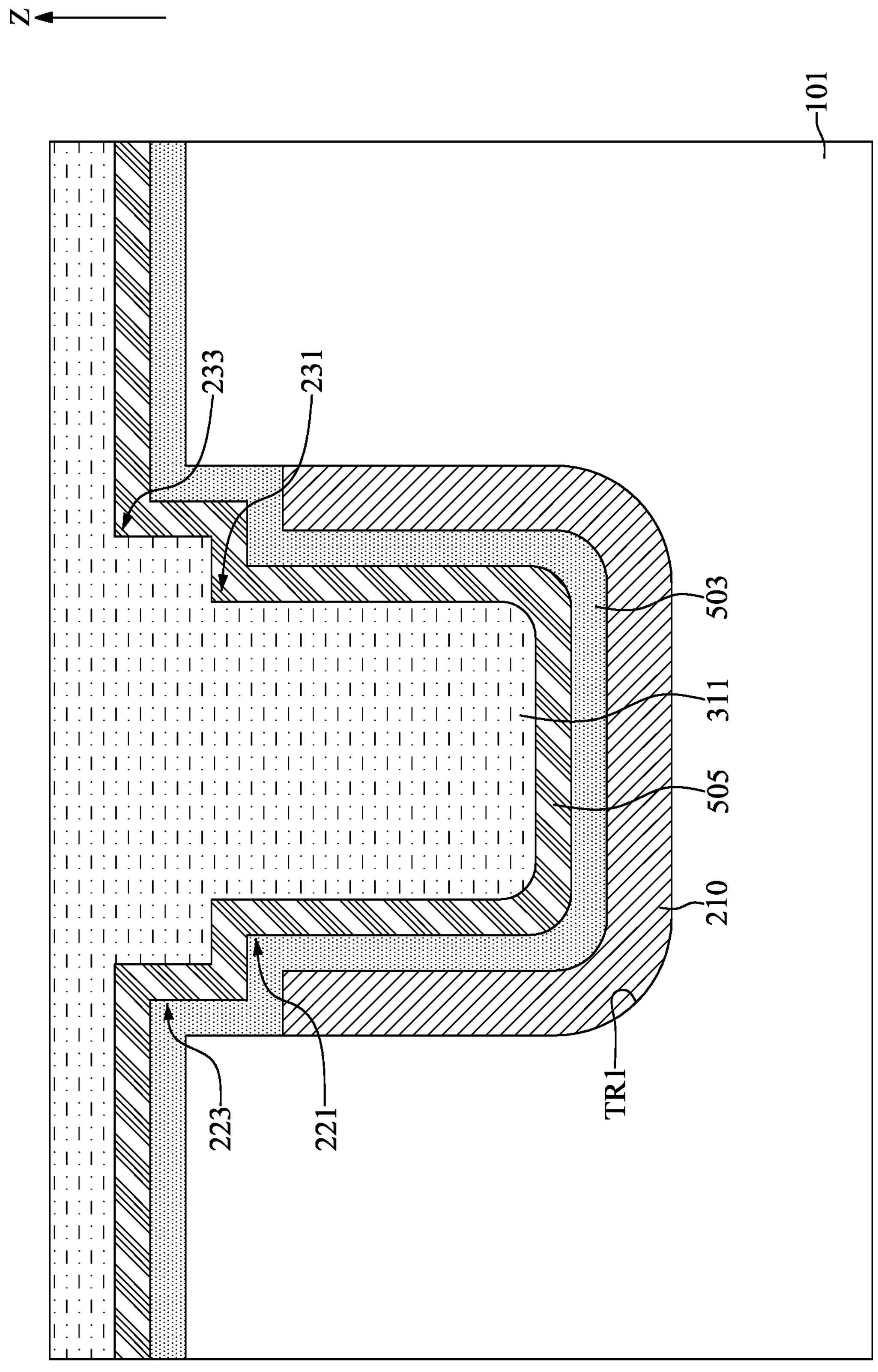
FIGS. 18 to 29 illustrate, in schematic cross-sectional view diagrams, part of a flow for fabricating a semiconductor device in accordance with another embodiment of the present disclosure.

With reference to FIG. 18, an intermediate semiconductor device may be fabricated with a procedure similar to that illustrated in FIGS. 2 to 9, and descriptions thereof are not repeated herein.

With reference to FIG. 18, a bottom interconnector layer 311 may be formed on the layer of second assisting material 505 and completely fill the first trench TR1. In some embodiments, the bottom interconnector layer 311 may be a work function layer. In some embodiments, the bottom interconnector layer 311 may be formed of, for example, titanium, titanium nitride, silicon, silicon germanium, or a combination thereof. It should be noted that the term "work function" refers to the bulk chemical potential of a material (e.g., metal) relative to the vacuum level.

Figure 19:
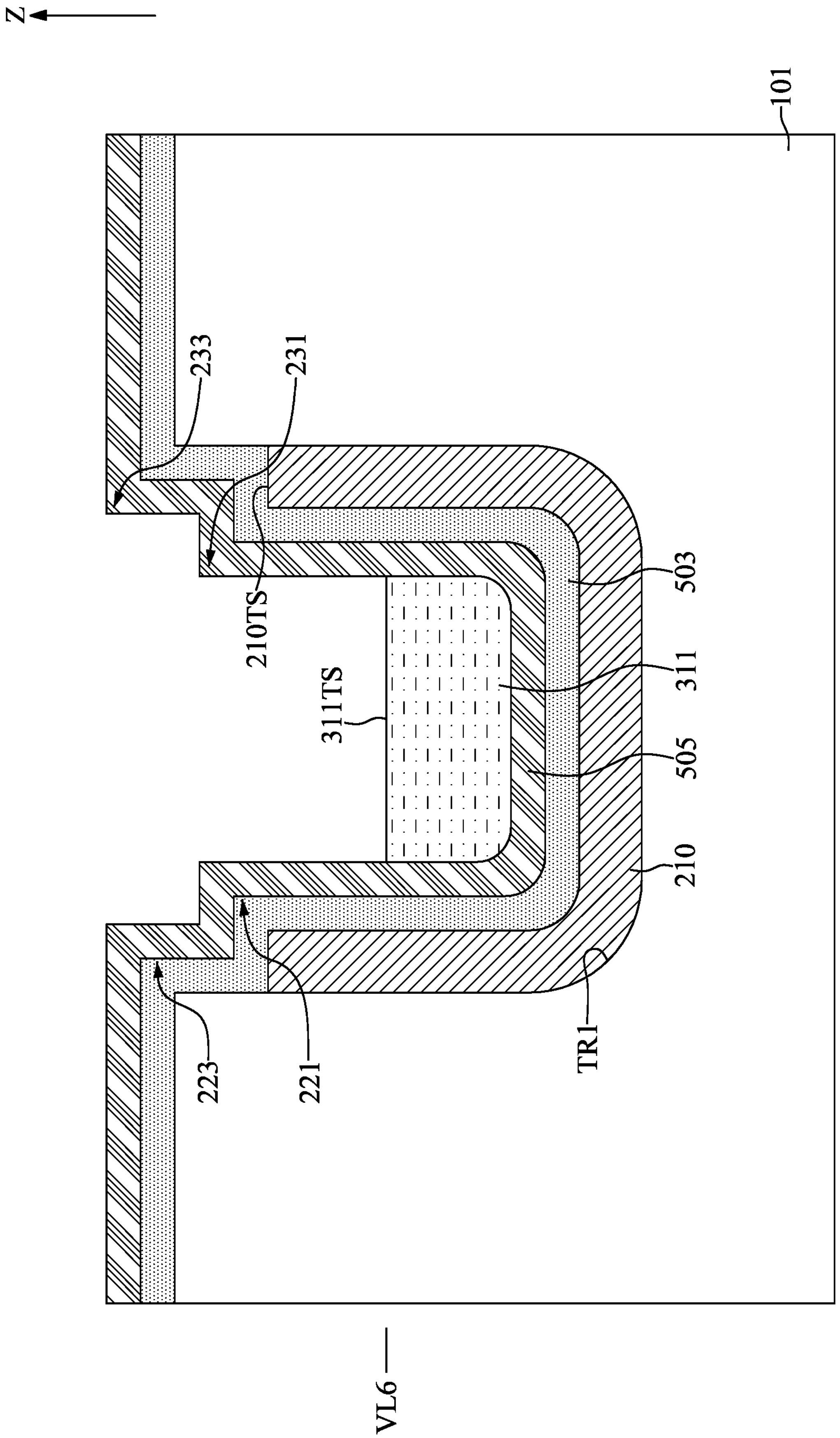

With reference to FIG. 19, a first etching back process may be performed to recess the bottom interconnector layer 311. In some embodiments, the etch rate ratio of the bottom interconnector layer 311 to the second assisting material 505 may be between about 100:1 and about 1.05:1, between about 15:1 and about 2:1, or between about 10:1 and about 2:1 during the first etching back process. After the first etching back process, the top surface 311TS of the bottom interconnector layer 311 may be recessed to a vertical level VL6 lower than the top surface 210TS of the first insulating layer 210.

Figure 20:
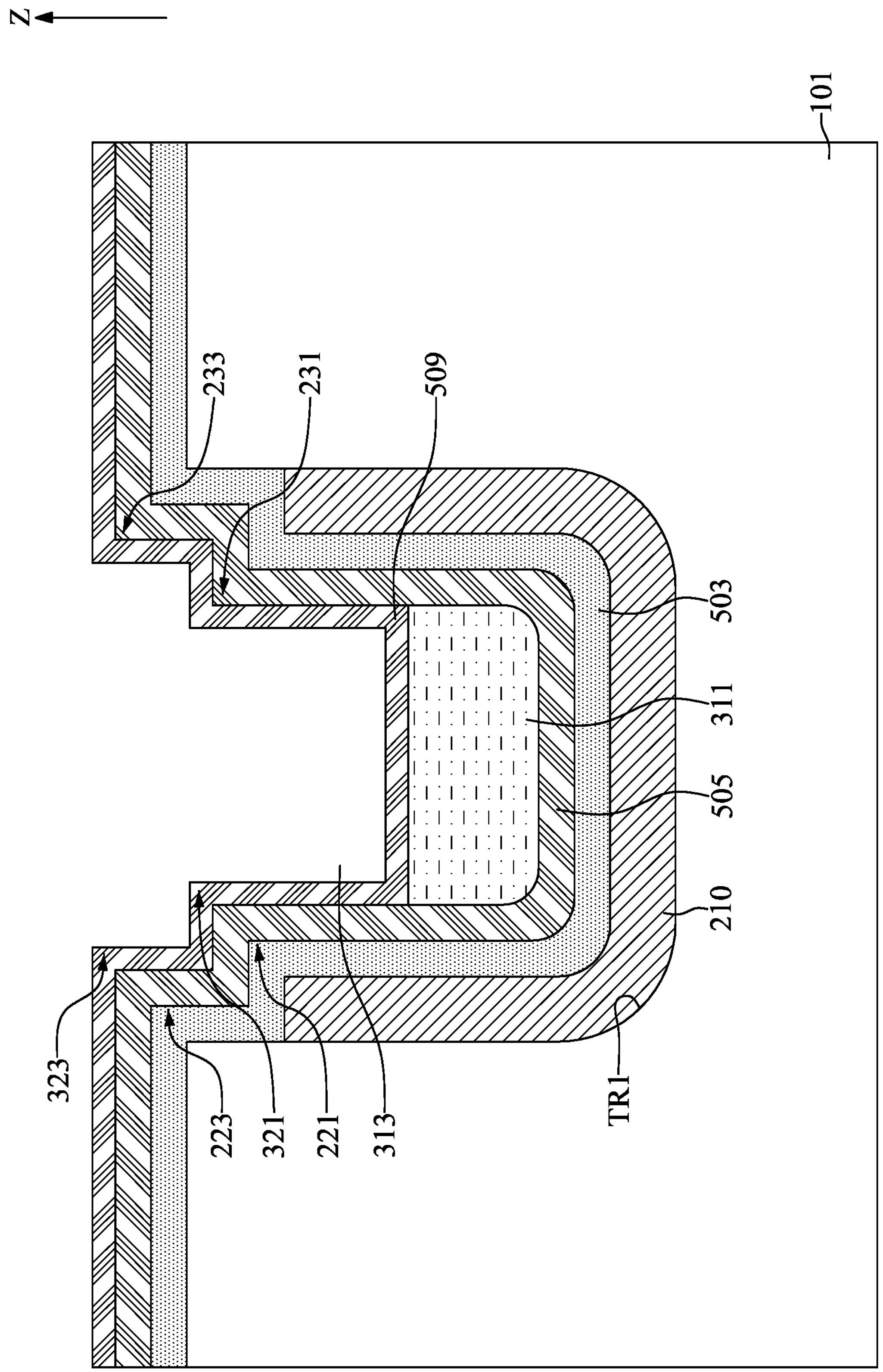

With reference to FIG. 20, a layer of first liner material 509 may be conformally formed on the bottom interconnector layer 311 and on the layer of second assisting material 505. In some embodiments, the first liner material 509 may be a material having etching selectivity to the second assisting material 505. In some embodiments, the first liner material 509 may be, for example, a material including $sp^2$ hybridized carbon atoms. In some embodiments, the first liner material 509 may be, for example, a material including carbons having hexagonal crystal structures. In some embodiments, the first liner material 509 may be, for example, graphene, graphite, or the like.

In some embodiments, the layer of first liner material 509 may be formed on a catalyst substrate and then transferred onto the intermediate semiconductor device illustrated in FIG. 19. The catalyst substrate may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, the layer of first liner material 509 may be formed with the assistance of catalysts. The catalysts may be single crystalline metal or polycrystalline metal, binary alloy, or liquid metal. The single crystalline metal or polycrystalline metal may be, for example, nickel, copper, cobalt, platinum, silver, ruthenium, iridium, or palladium. The binary alloy may be, for example, alloy of iron and nickel, alloy of copper and nickel, alloy of nickel and molybdenum, alloy of gold and nickel, and alloy of cobalt and copper. The liquid metal may be, for example, liquid gallium, liquid indium, or liquid copper.

In some embodiments, a catalytic conductive layer (not shown for clarity) may be conformally formed on the bottom interconnector layer 311 and on the layer of second assisting material 505. The layer of first liner material 509 may be formed on the catalytic conductive layer. The catalytic conductive layer may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

With reference to FIG. 20, the layer of first liner material 509 may include a first step portion 321 and a second step portion 323. The first step portion 321 may cover the first step portion 231. The second step portion 323 may cover the second step portion 233.

Figure 21:
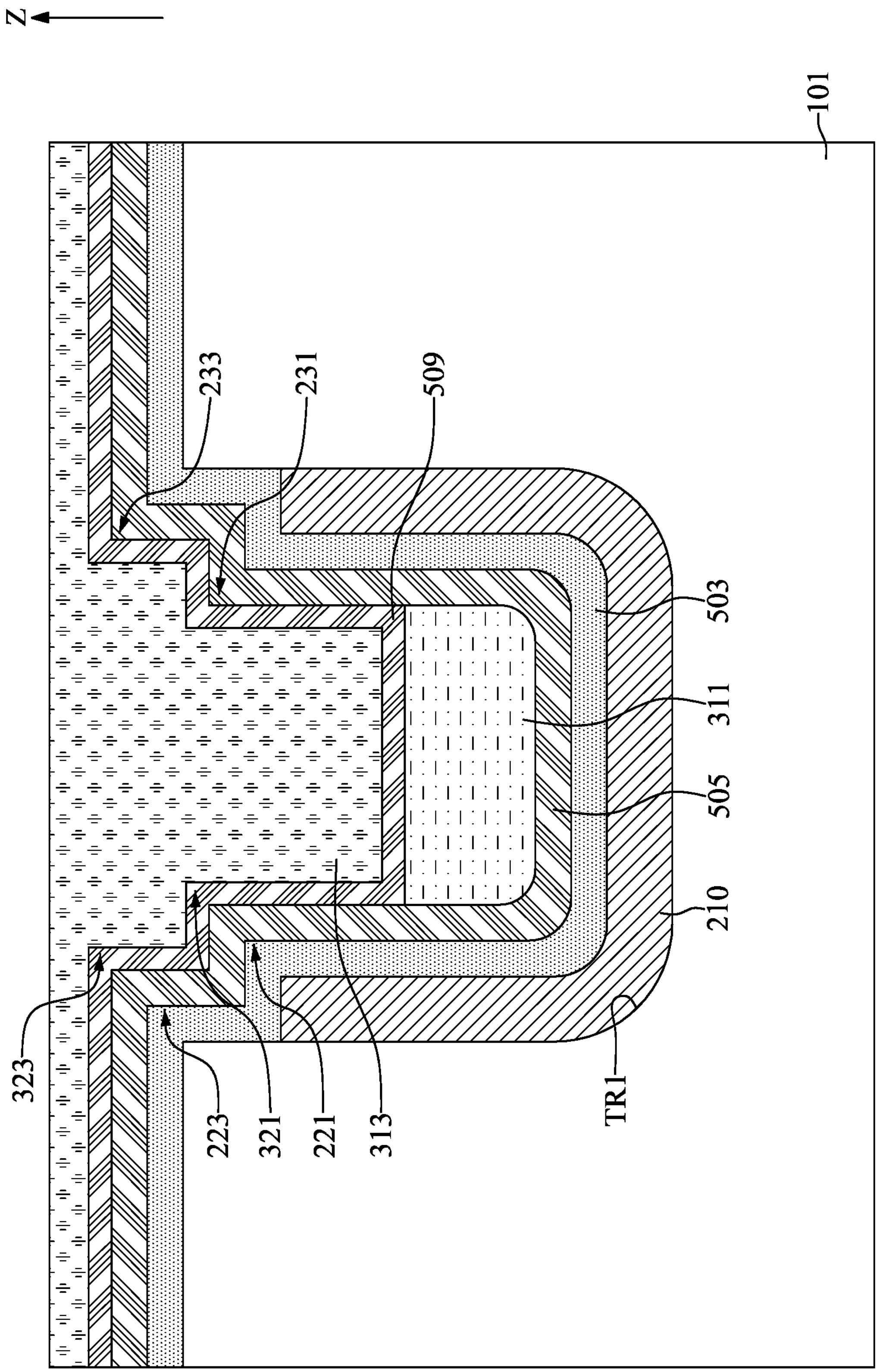

With reference to FIG. 21, a middle interconnector layer 313 may be formed on the layer of first liner material 509 and completely fill the first trench TR1. In some embodiments, the middle interconnector layer 313 may include, for example, tungsten, tungsten nitride, or a combination thereof. In some embodiments, the middle interconnector layer 313 may be formed by, for example, a pulse nucleation method, chemical vapor deposition, physical vapor deposition, or other applicable deposition processes. In some embodiments, a planarization process, such as chemical mechanical polishing, may be performed to remove excess material and provide a substantially flat surface for subsequent processing steps.

With reference to FIG. 21, a second etching back process may be performed to remove portions of the middle interconnector layer 313. In some embodiments, the etch rate ratio of the middle interconnector layer 313 to the first liner material 509 may be between about 100:1 and about 1.05:1, between about 15:1 and about 2:1, or between about 10:1 and about 2:1 during the second etching back process. After the second etching back process, the top surface 313TS of the middle interconnector layer 313 may be at a vertical level VL7 lower than the top surface 210TS of the first insulating layer 210.

Figure 22:
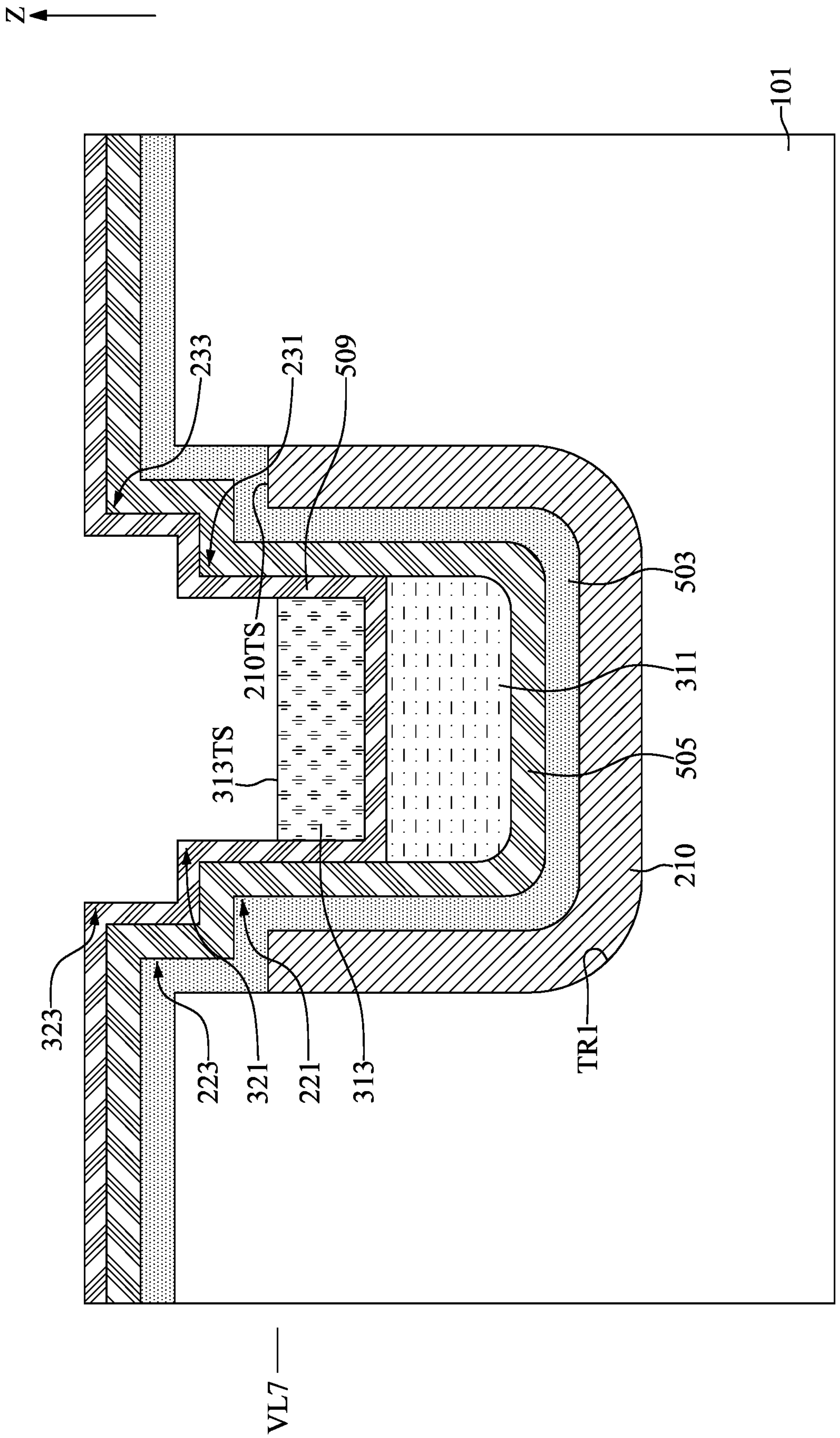

With reference to FIG. 22, a layer of second liner material 511 may be conformally formed on the middle interconnector layer 313 and on the layer of first liner material 509. In some embodiments, the second liner material 511 may be, for example, a material including $sp^2$ hybridized carbon atoms. In some embodiments, the second liner material 511 may be, for example, a material including carbons having hexagonal crystal structures. In some embodiments, the second liner material 511 may be, for example, graphene, graphite, or the like.

In some embodiments, the layer of second liner material 511 may be formed on a catalyst substrate and then transferred onto the intermediate semiconductor device illustrated in FIG. 22. The catalyst substrate may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, the layer of second liner material 511 may be formed with the assistance of catalysts. The catalysts may be single crystalline metal or polycrystalline metal, binary alloy, or liquid metal. The single crystalline metal or polycrystalline metal may be, for example, nickel, copper, cobalt, platinum, silver, ruthenium, iridium, or palladium. The binary alloy may be, for example, alloy of iron and nickel, alloy of copper and nickel, alloy of nickel and molybdenum, alloy of gold and nickel, and alloy of cobalt and copper. The liquid metal may be, for example, liquid gallium, liquid indium, or liquid copper.

In some embodiments, a catalytic conductive layer (not shown for clarity) may be conformally formed on the middle interconnector layer 313 and on the layer of first liner material 509. The layer of second liner material 511 may be formed on the catalytic conductive layer. The catalytic conductive layer may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

Figure 23:
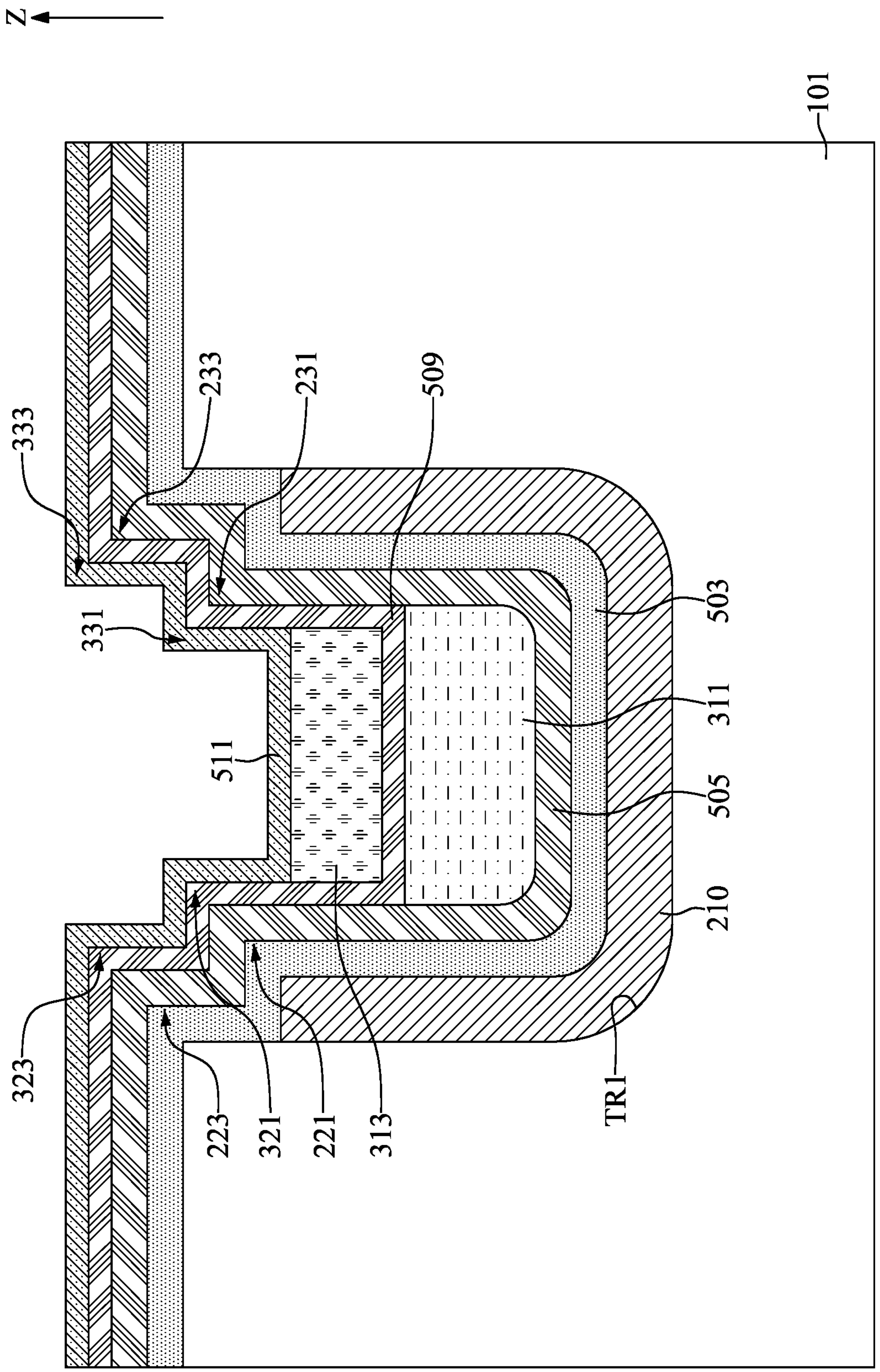

With reference to FIG. 23, the layer of second liner material 511 may include a first step portion 331 and a second step portion 333. The first step portion 331 may cover the first step portion 321. The second step portion 333 may cover the second step portion 323.

Figure 24:
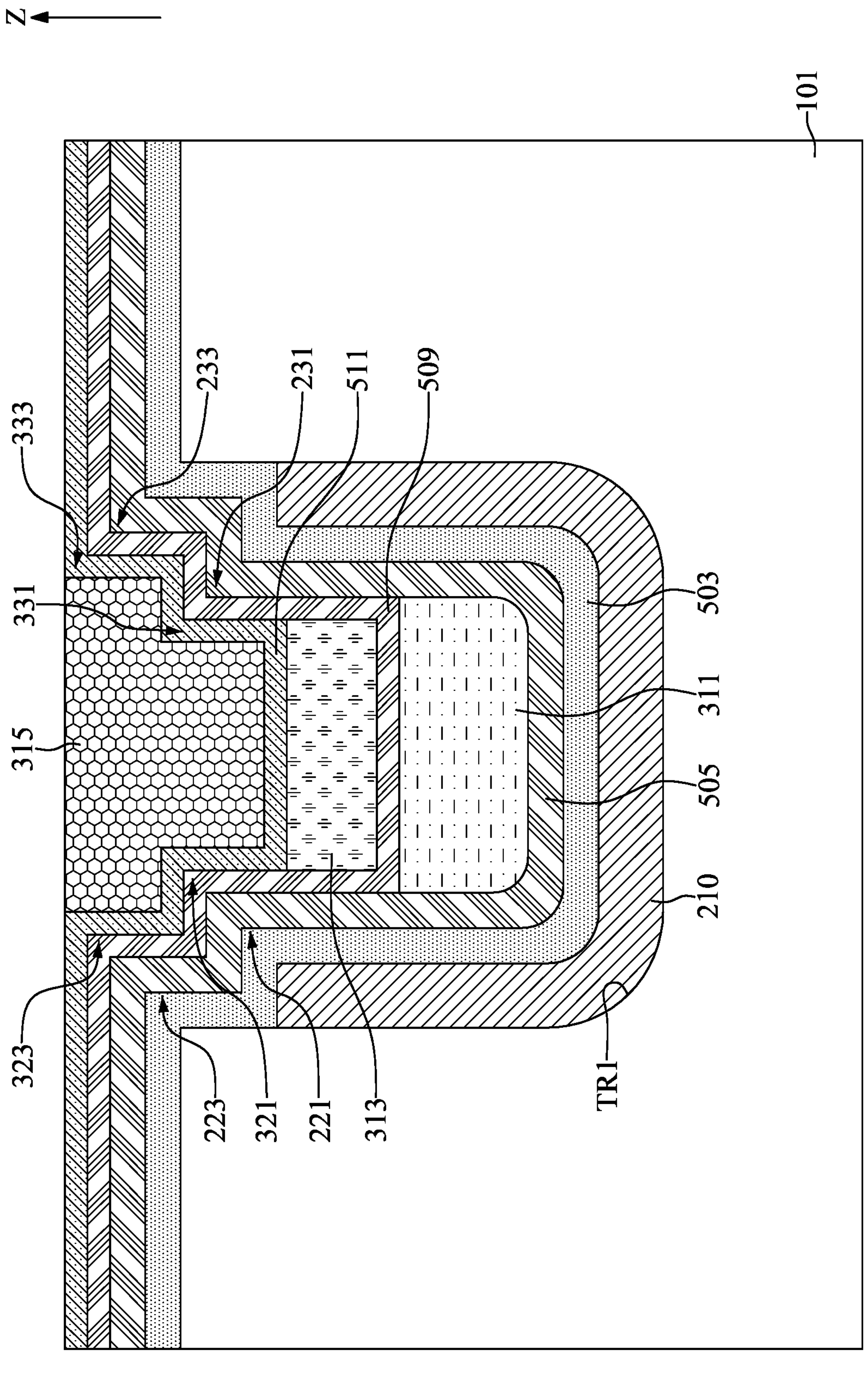

With reference to FIG. 24, a top interconnector layer 315 may be formed on the layer of second liner material 511 and completely fill the first trench TR1. A planarization process, such as chemical mechanical polishing, may be performed until the layer of second liner material 511 is exposed to remove excess material and provide a substantially flat surface for subsequent processing steps. In some embodiments, the top interconnector layer 315 may include, for example, molybdenum or other applicable conductive materials.

In some embodiments, the top interconnector layer 315 formed of molybdenum may be formed by a chemical vapor deposition process. For example, the intermediate semiconductor device illustrated in FIG. 23 may be exposed to a molybdenum precursor and a reactant. In some embodiments, the reactant may flow continuously and the molybdenum precursor flow to the chamber may be turned on and off.

In some embodiments, the molybdenum precursor may include a molybdenum halide. In some embodiments, the molybdenum halide may include molybdenum fluoride, molybdenum chloride, or combinations thereof. In some embodiments, the molybdenum precursor may be flowed over the intermediate semiconductor device illustrated in FIG. 23 using a carrier gas. In some embodiments, the carrier gas may be flowed through an ampoule including the molybdenum precursor. In some embodiments, the carrier gas may be an inert gas. In some embodiments, the inert gas may include one or more of $N_2$, Ar, and He.

In some embodiments, the flow rate of the molybdenum precursor may be in a range of from 100 slm to 1000 slm, from 100 slm to 700 slm, from 100 slm to 400 slm, from 400 slm to 1000 slm, from 400 slm to 700 slm or from 700 slm to 1000 slm. In some embodiments, the duration of the molybdenum precursor may be in a range of from 0.3 seconds to 5 seconds, from 0.3 seconds to 3 seconds, from 0.3 seconds to 1 seconds, from 1 seconds to 5 seconds, from 1 seconds to 3 seconds or from 3 seconds to 5 seconds.

In some embodiments, the intermediate semiconductor device illustrated in FIG. 23 may be exposed to a continuous flow or a plurality of pulses of the molybdenum precursor. In some embodiments, the plurality of pulses of the molybdenum precursor may have a wait time in a range of from 0.3 seconds to 30 seconds, from 0.3 seconds to 10 seconds, from 0.3 seconds to 5 seconds, from 0.3 seconds to 1 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds.

In some embodiments, each of the plurality of pulses of the molybdenum precursor may be applied for a time duration in a range of from 0.3 seconds to 5 seconds, from 0.3 seconds to 3 seconds, from 0.3 seconds to 1 seconds, from 1 seconds to 5 seconds, from 1 seconds to 3 seconds or from 3 seconds to 5 seconds. In some embodiments, at least one of the plurality of pulses of the molybdenum precursor may be applied for a time duration in a range of from 0.3 seconds to 5 seconds, from 0.3 seconds to 3 seconds, from 0.3 seconds to 1 seconds, from 1 seconds to 5 seconds, from 1 seconds to 3 seconds or from 3 seconds to 5 seconds.

In some embodiments, the reactant may include an oxidizing agent, a reducing agent, or a combination thereof. In some embodiments, the reactant may include hydrogen, ammonia, silane, polysilane, or a combination thereof. In some embodiments, silane may be selected from one or more of disilane, trisilane, tetrasilane, higher order silanes, and substituted silane. In some embodiments, the reactant may be flowed over the intermediate semiconductor device illustrated in FIG. 23 using a carrier gas. In some embodiments, the carrier gas may be an inert gas. In some embodiments, the inert gas may include one or more of $N_2$, Ar, and He.

In some embodiments, the flow rate of the reactant may be in a range of from 0.5 slm to 15 slm, from 0.5 slm to 10 slm, from 0.5 slm to 5 slm, from 5 slm to 15 slm, from 5 slm to 10 slm or from 10 slm to 15 slm. In some embodiments, the duration of the reactant may be in a range of from 0.5 seconds to 10 seconds, from 0.5 seconds to 5 seconds, from 0.5 seconds to 1 seconds, from 1 seconds to 10 seconds, from 1 seconds to 5 seconds or from 5 seconds to 10 seconds.

In some embodiments, the intermediate semiconductor device illustrated in FIG. 23 may be exposed to a continuous flow or a plurality of pulses of the reactant. In some embodiments, the plurality of pulses of the reactant may have a wait time in a range of from 0.3 seconds to 30 seconds, from 0.3 seconds to 10 seconds, from 0.3 seconds to 5 seconds, from 0.3 seconds to 1 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds.

In some embodiments, each of the plurality of pulses of the reactant may be applied for a time duration in a range of from 0.5 seconds to 10 seconds, from 0.5 seconds to 5 seconds, from 0.5 seconds to 1 seconds, from 1 seconds to 10 seconds, from 1 seconds to 5 seconds or from 5 seconds to 10 seconds. In some embodiments, at least one of the plurality of pulses of the first reactant may be applied for a time duration in a range of from 0.5 seconds to 10 seconds, from 0.5 seconds to 5 seconds, from 0.5 seconds to 1 seconds, from 1 seconds to 10 seconds, from 1 seconds to 5 seconds or from 5 seconds to 10 seconds.

In some embodiments, the top interconnector layer 315 may be formed at a pressure in a range of from 2 Torr to 60 Torr, from 2 Torr to 40 Torr, from 2 Torr to 20 Torr, from 20 Torr to 60 Torr, from 20 Torr to 40 Torr or from 40 Torr to 60 Torr. In some embodiments, the top interconnector layer 315 may be formed at a temperature in a range of from 350° C. to 550° C., from 350° C. to 500° C., from 350° C. to 450° C., from 350° C. to 400° C., from 400° C. to 550° C., from 400° C. to 500° C., from 400° C. to 450° C., from 450° C. to 550° C., from 450° C. to 500° C. or from 500° C. to 550° C.

In some embodiments, an optional annealing process may be performed after the formation of the top interconnector layer 315. In some embodiments, the annealing process may be performed at temperatures in the range of from 100° C. to 550° C., from 100° C. to 450° C., from 100° C. to 350° C., from 100° C. to 250° C., from 200° C. to 550° C., from 200° C. to 450° C., from 200° C. to 350° C., from 300° C. to 550° C., from 300° C. to 450° C. or from 400° C. to 550° C.

In some embodiments, the environment of the annealing process may include one or more of an inert gas (e.g., molecular nitrogen, argon) or a reducing gas (e.g., molecular hydrogen or ammonia).

In some embodiments, the duration of the annealing process may be in the range of from 1 hour to 24 hour, from 1 hour to 20 hour, from 1 hour to 15 hour, from 1 hour to 10 hour, from 1 hour to 5 hour, from 5 hour to 24 hour, from 5 hour to 20 hour, from 5 hour to 15 hour, from 5 hour to 10 hour, from 10 hour to 24 hour, from 10 hour to 20 hour, from 10 hour to 15 hour, from 15 hour to 24 hour, from 15 hour to 20 hour or from 20 hour to 24 hour. The annealing process may increase the density, decrease the resistivity, and/or increase the purity of the top interconnector layer 315.

Figure 25:
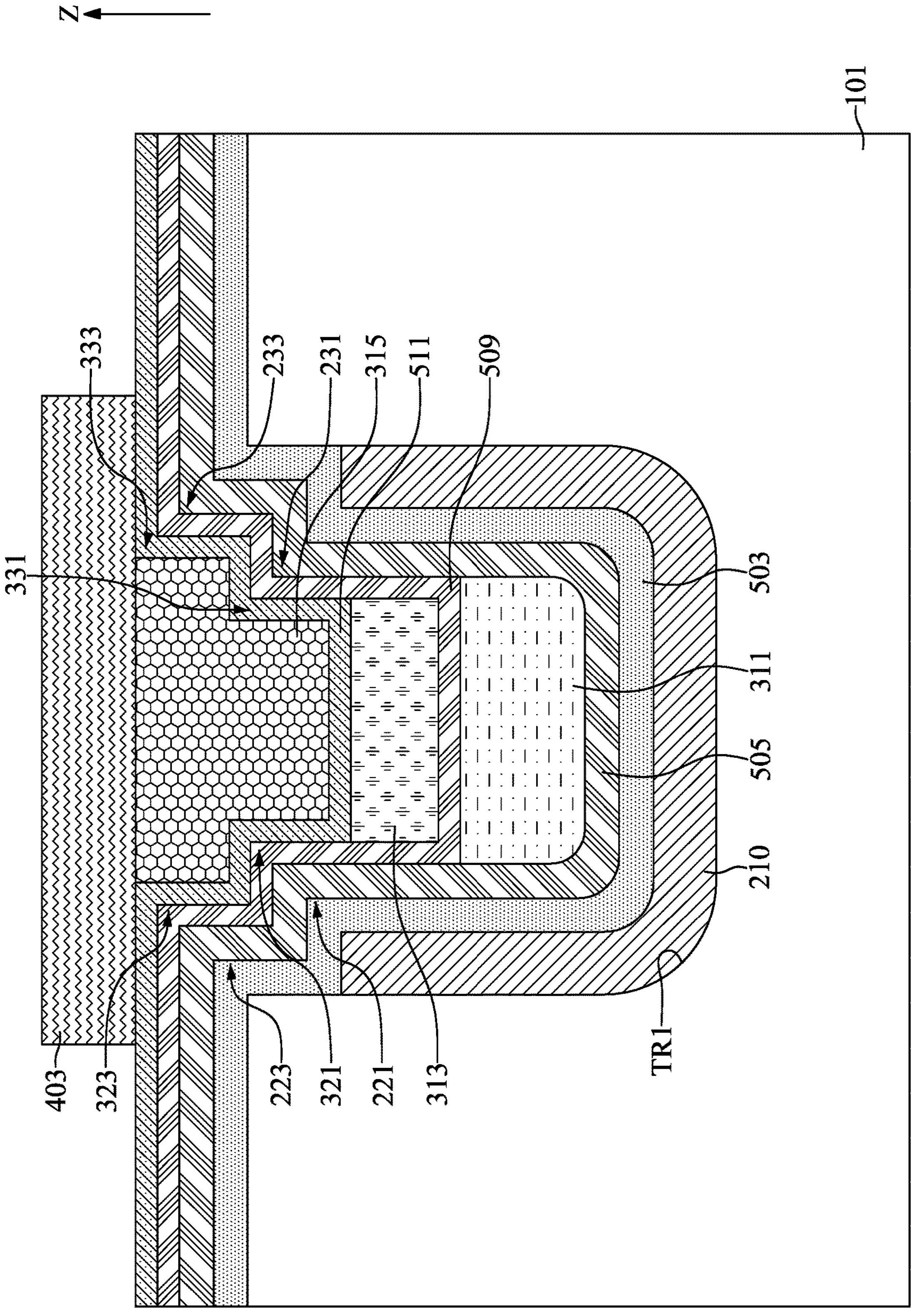

With reference to FIG. 25, a second mask layer 403 may be formed on the top interconnector layer 315 and cover a portion of the layer of second liner material 511. The second mask layer 403 may be formed with a procedure similar to that illustrated in FIG. 12, and descriptions thereof are not repeated herein.

Figure 26:
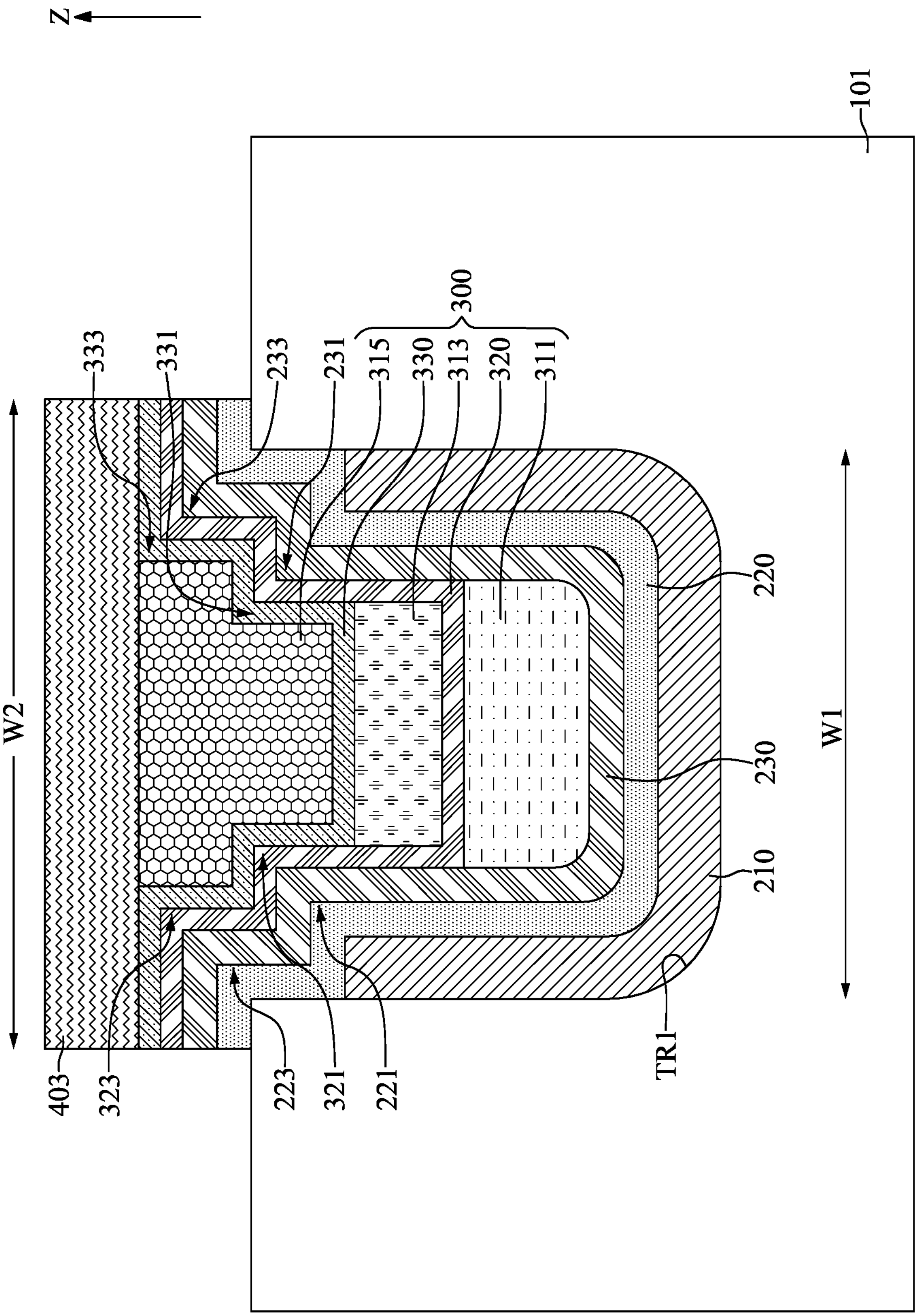

With reference to FIG. 26, an etching process may be performed to remove portions of the second liner material

511, the first liner material 509, the layer of second assisting material 505, and the layer of first assisting material 503. After the etching process, the remaining first assisting material 503 may be turned into the first assisting layer 220. The first assisting layer 220 may be conformally formed on the first insulating layer 210 and may include a U-shaped cross-sectional profile including the first step portion 221 and the second step portion 223. The remaining second assisting material 505 may be turned into the second assisting layer 230. The second assisting layer 230 may be conformally formed on the first assisting layer 220 and may include a U-shaped cross-sectional profile including the first step portion 231 and the second step portion 233. The remaining first liner material 509 may be referred to as a first liner layer 320 and may include a U-shaped cross-sectional profile including the first step portion 321 and the second step portion 323. The remaining second liner material 511 may be referred to as a second liner layer 330 and may include a U-shaped cross-sectional profile including the first step portion 331 and the second step portion 333. The second mask layer 403 may be removed after the etching process.

With reference to FIG. 26, the second liner layer 330, the first liner layer 320, the second assisting layer 230, and the first assisting layer 220 may have a same width W2. The width W2 may be greater than the width W1 of the first insulating layer 210. The bottom interconnector layer 311, the first liner layer 320, the middle interconnector layer 313, the second liner layer 330, and the top interconnector layer 315 together configure a conductive structure 300.

Figure 27:
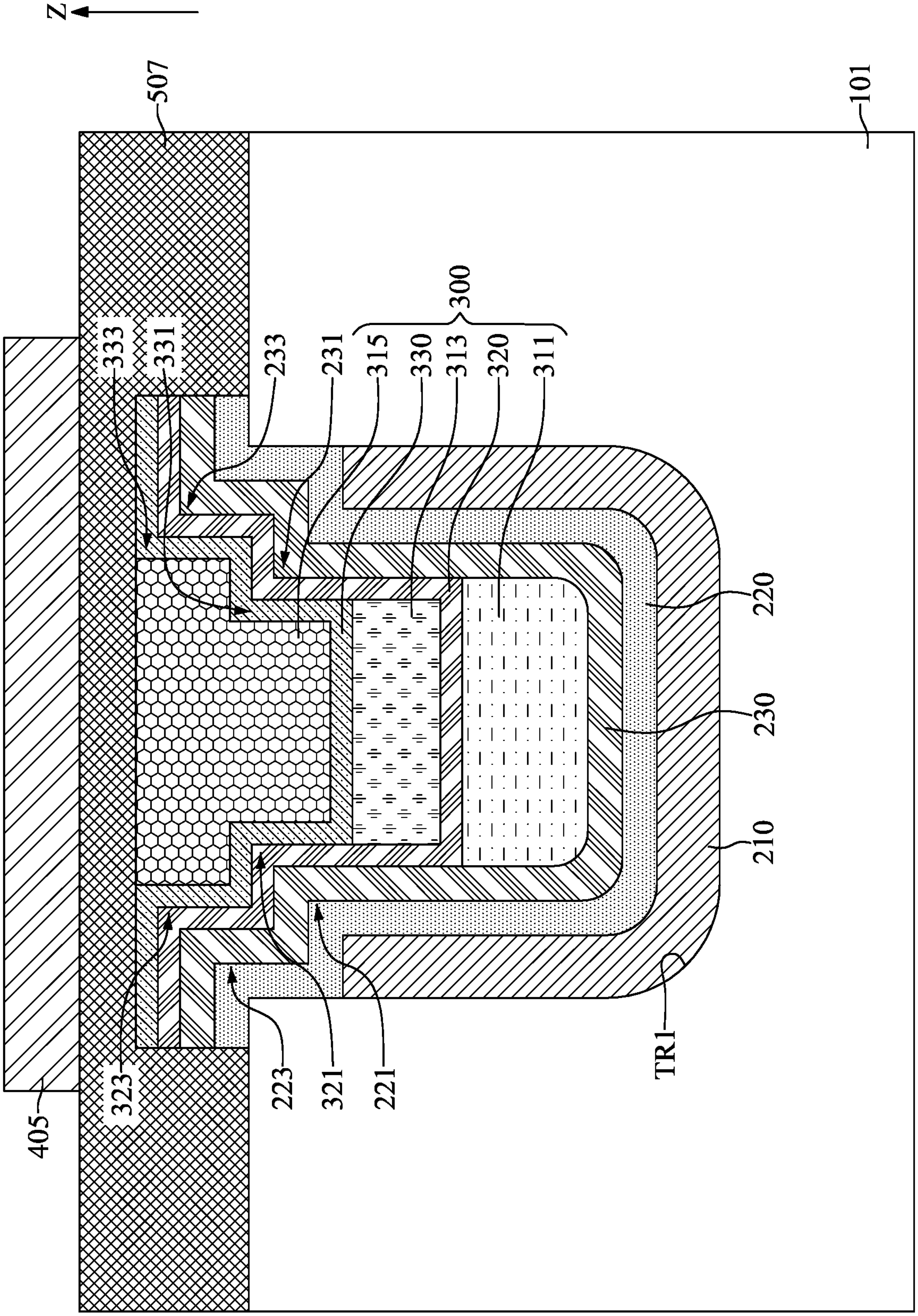

With reference to FIG. 27, a layer of second insulating material 507 and the third mask layer 405 may be formed with a procedure similar to that illustrated in FIG. 14, and descriptions thereof are not repeated herein. The layer of second insulating material 507 may cover the conductive structure 300.

Figure 28:
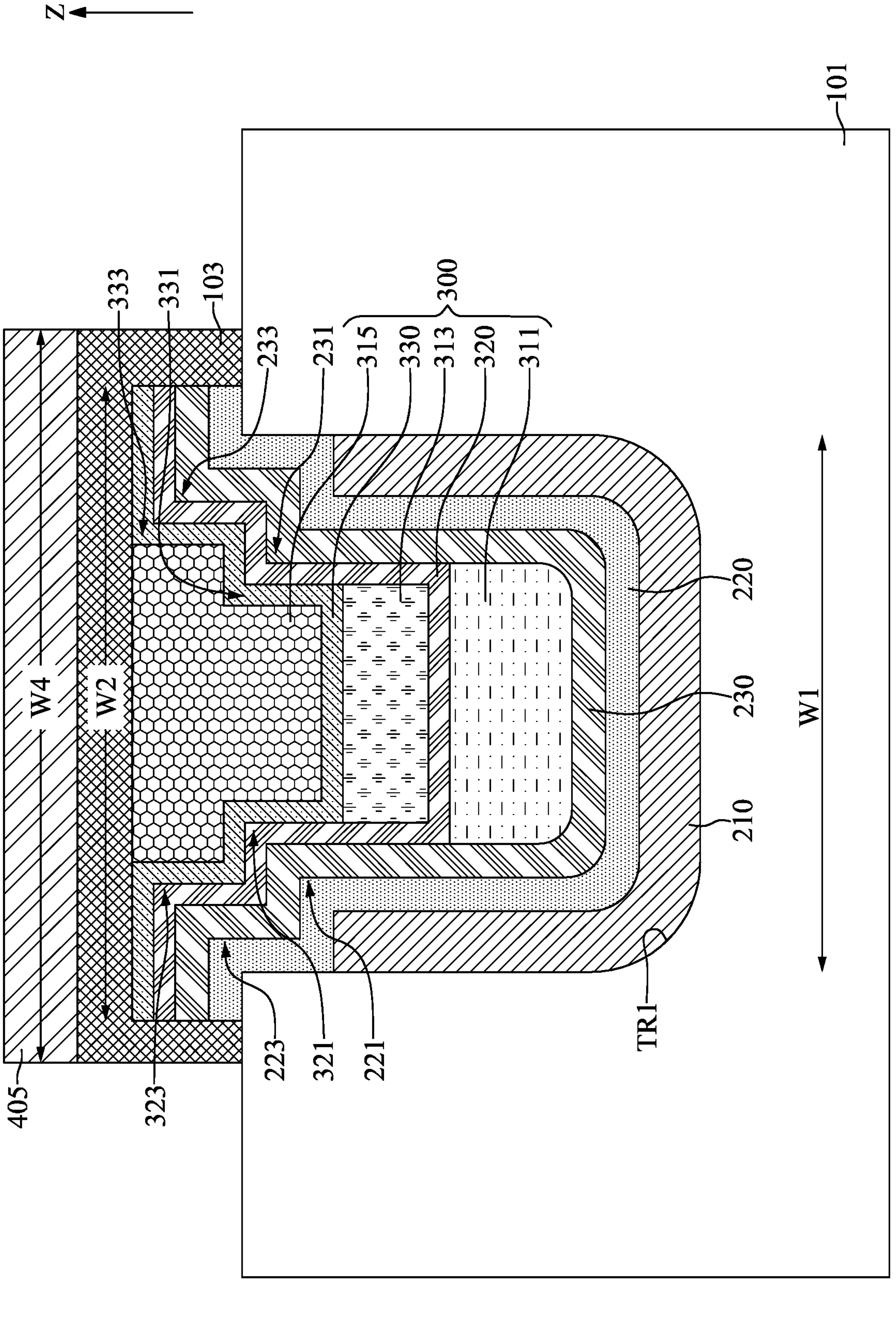

With reference to FIG. 28, an etching process may be performed with a procedure similar to that illustrated in FIG. 15, and descriptions thereof are not repeated herein. In some embodiments, the width W4 of the capping dielectric layer 103 may be greater than the width W1 of the first insulating layer 210. In some embodiments, the width W4 of the capping dielectric layer 103 may be greater than the width W2 of the first assisting layer 220, the second assisting layer 230, the first liner layer 320, or the second liner layer 330. The first insulating layer 210, the conductive structure 300, and the capping dielectric layer 103 may configure a gate structure.

Figure 29:
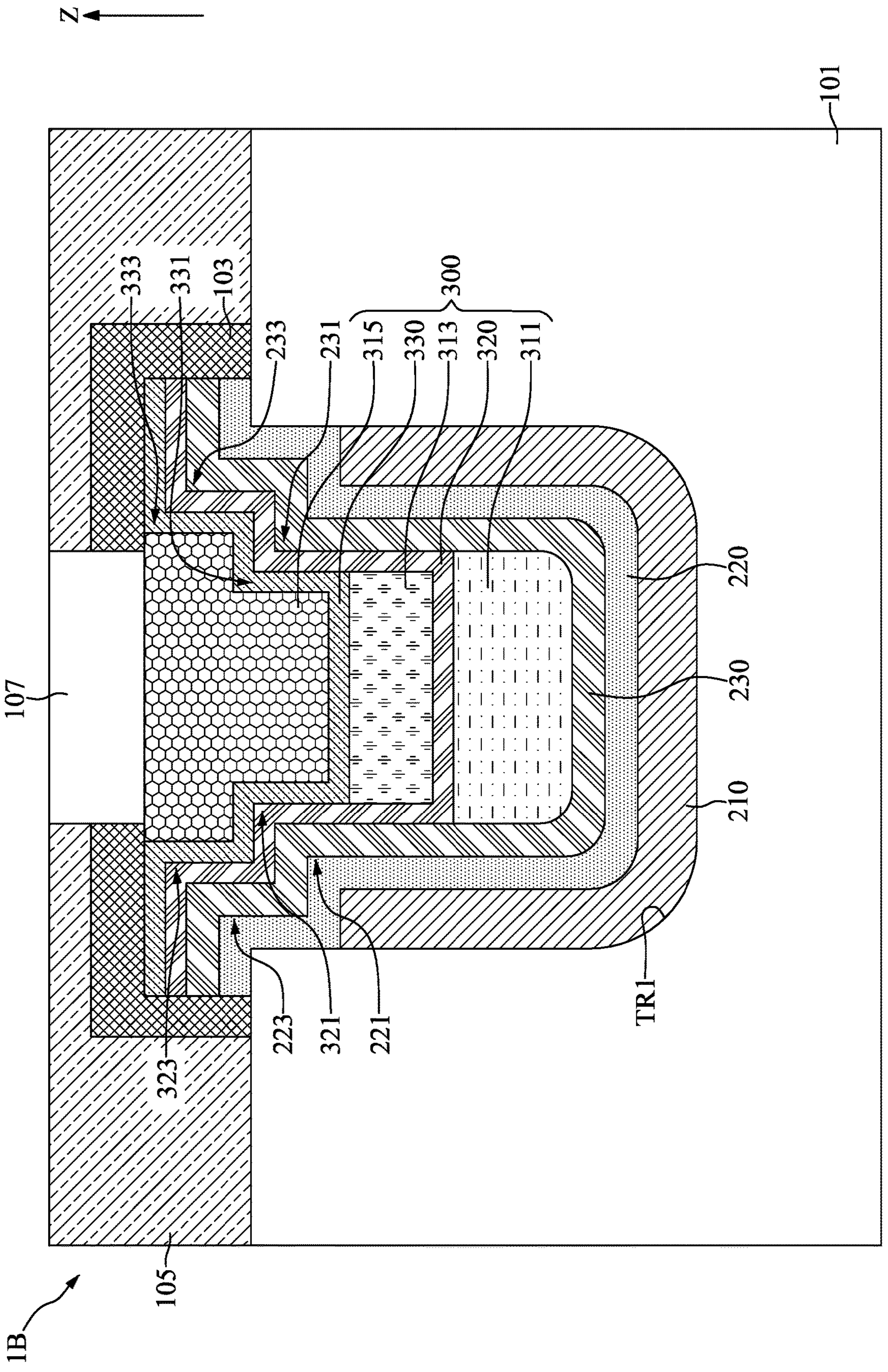

With reference to FIG. 29, the first dielectric layer 105 may be formed with a procedure similar to that illustrated in FIG. 16, and descriptions thereof are not repeated herein. The first conductive layer 107 may be formed along the first dielectric layer 105 and the capping dielectric layer 103 and formed on the top interconnector layer 315. In some embodiments, the first conductive layer 107 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The first conductive layer 107 may electrically couple the gate structure to other conductive features.

The first liner layer 320 and the middle interconnector layer 313 may be configured to tune the work function cooperating with the bottom interconnector layer 311 so as to obtain the resulting gate structure has a low resistance. As a result, the performance of the semiconductor device 1B may be improved.

In some embodiments, the semiconductor device 1B may have a work function greater than or equal to 4.3 eV. In some embodiments, the semiconductor device 1B may have a work function greater than or equal to 4.5 eV. In some embodiments, the semiconductor device 1B may have a work function greater than or equal to 4.3 eV, including greater than or equal to 4.4 eV, greater than or equal to 4.5 eV, greater than or equal to 4.6, greater than or equal to 4.7 eV, greater than or equal to 4.8 eV, greater than or equal to 4.9 eV, greater than or equal to 5.0 eV, greater than or equal to 5.1 eV, or greater than or equal to 5.2 eV.

In some embodiments, the semiconductor device 1B may have a resistance less than or equal to 40 μΩ-cm, less than or equal to 30μΩ-cm, less than or equal to 25μΩ-cm, or less than or equal to 20 μΩ-cm, or less than or equal to 15 μΩ-cm at a total thickness of 100 Å. In some embodiments, the semiconductor device 1B may have resistance less than or equal to 20 μΩ-cm at a total thickness of 100 Å. In some embodiments, the semiconductor device 1B may have a resistance in a range of from 50μΩ-cm to 5μΩ-cm, from 40μΩ-cm to 10μΩ-cm, from 30μΩ-cm to 10μΩ-cm, from 25μΩ-cm to 10μΩ-cm, from 20μΩ-cm to 10μΩ-cm at a total thickness of 100 Å.

One aspect of the present disclosure provides a semiconductor device including a substrate; a first insulating layer inwardly positioned in the substrate and including a U-shaped cross-sectional profile; a first assisting layer conformally positioned on the first insulating layer and the substrate; a first filler layer positioned on the first assisting layer; and a capping dielectric layer positioned on the substrate and covering the first assisting layer and the first filler layer. A top surface of the first insulating layer is at a vertical level lower than a top surface of the substrate. The first assisting layer includes a first step portion and a second step portion, the first step portion of the first assisting layer is positioned adjacent to the top surface of the first insulating layer, and the second step portion of the first assisting layer is positioned adjacent to the top surface of the substrate.

Another aspect of the present disclosure provides a semiconductor device including a substrate; a first insulating layer inwardly positioned in the substrate and including a U-shaped cross-sectional profile; a first assisting layer conformally positioned on the first insulating layer and the substrate; a conductive structure including: a bottom interconnector layer positioned on the first assisting layer, a first liner layer conformally positioned on the bottom interconnector layer and the first assisting layer, and a top interconnector layer positioned on the first liner layer; and a capping dielectric layer positioned on the substrate and covering the first assisting layer and the conductive structure. A top surface of the first insulating layer is at a vertical level lower than a top surface of the substrate. The first assisting layer includes a first step portion and a second step portion, the first step portion of the first assisting layer is positioned adjacent to the top surface of the first insulating layer, and the second step portion of the first assisting layer is positioned adjacent to the top surface of the substrate.

Another aspect of the present disclosure provides a method for fabricating a semiconductor device including providing a substrate; forming a first trench in the substrate; conformally forming a first insulating layer in the first trench; conformally forming a first assisting layer on the first insulating layer and the substrate; forming a first filler layer on the first assisting layer; and forming a capping dielectric layer on the substrate and covering the first assisting layer and the first filler layer. A top surface of the first insulating layer is at a vertical level lower than a top surface of the substrate. The first assisting layer includes a first step portion and a second step portion, the first step portion of the first assisting layer is adjacent to the top surface of the first insulating layer, and the second step portion of the first assisting layer is adjacent to the top surface of the substrate.

Due to the design of the semiconductor device of the present disclosure, the first assisting layer 220 formed of manganese may prevent metal ion diffusion to the substrate 101. As a result, the electron migration of the resulting semiconductor device 1A may be reduced. In addition, the second assisting layer 230 including the titanium silicon nitride may have a low resistivity and an excellent barrier property and is stable under heat. Thus, the semiconductor device 1A including the second assisting layer 230 formed of titanium silicon nitride may have excellent characteristics. As a result, the performance of the resulting semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
- a substrate;
- a first insulating layer inwardly positioned in the substrate and comprising a U-shaped cross-sectional profile;
- a first assisting layer conformally positioned on the first insulating layer and the substrate;
- a conductive structure comprising:
  - a bottom interconnector layer positioned on the first assisting layer;
  - a first liner layer conformally positioned on the bottom interconnector layer and the first assisting layer; and
  - a top interconnector layer positioned on the first liner layer; and
- a capping dielectric layer positioned on the substrate and covering the first assisting layer and the conductive structure;
- wherein a top surface of the first insulating layer is at a vertical level lower than a top surface of the substrate;
- wherein the first assisting layer comprises a first step portion and a second step portion, the first step portion of the first assisting layer is positioned adjacent to the top surface of the first insulating layer, and the second step portion of the first assisting layer is positioned adjacent to the top surface of the substrate.

2. The semiconductor device of claim 1, wherein the first assisting layer comprises manganese.

3. The semiconductor device of claim 2, wherein the bottom interconnector layer comprises titanium, titanium nitride, silicon, silicon germanium, or a combination thereof.

4. The semiconductor device of claim 3, wherein the first liner layer comprises a material comprising $sp^2$ hybridized carbon atoms.

5. The semiconductor device of claim 4, wherein the conductive structure further comprises a middle interconnector layer positioned between the first liner layer and the top interconnector layer.

6. The semiconductor device of claim 5, wherein the middle interconnector layer comprises tungsten, tungsten nitride, or a combination thereof.

7. The semiconductor device of claim 6, wherein the conductive structure further comprises a second liner layer conformally positioned between the first liner layer and the top interconnector layer and conformally positioned between the middle interconnector layer and the top interconnector layer.

8. The semiconductor device of claim 7, wherein the second liner layer comprises a material comprising $sp^2$ hybridized carbon atoms.

9. The semiconductor device of claim 8, wherein the top interconnector layer comprises molybdenum.

10. The semiconductor device of claim 9, wherein a width of the first liner layer is substantially the same as a width of the first assisting layer.

11. The semiconductor device of claim 10, further comprising a second assisting layer conformally positioned between the first assisting layer and the conductive structure.

12. The semiconductor device of claim 11, wherein the second assisting layer comprises a first step portion and a second step portion, the first step portion of the second assisting layer covers the first step portion of the first assisting layer, and the second step portion of the second assisting layer covers the second step portion of the first assisting layer.

13. The semiconductor device of claim 12, wherein the second assisting layer comprises titanium silicon nitride.

14. A method for fabricating a semiconductor device, comprising:
- providing a substrate;
- forming a first trench in the substrate;
- conformally forming a first insulating layer in the first trench;
- conformally forming a first assisting layer on the first insulating layer and the substrate;
- forming a first filler layer on the first assisting layer; and
- forming a capping dielectric layer on the substrate and covering the first assisting layer and the first filler layer;
- wherein a top surface of the first insulating layer is at a vertical level lower than a top surface of the substrate;
- wherein the first assisting layer comprises a first step portion and a second step portion, the first step portion of the first assisting layer is adjacent to the top surface of the first insulating layer, and the second step portion of the first assisting layer is adjacent to the top surface of the substrate.

15. The method of claim 14, wherein the first assisting layer comprises manganese.

16. The method of claim 15, further comprising conformally forming a second assisting layer between the first assisting layer and the first filler layer.

17. The method of claim 16, wherein the second assisting layer comprises titanium silicon nitride.

18. The method of claim 17, wherein the first filler layer comprises copper, aluminum, tungsten, or a combination thereof.

* * * * *